(12) United States Patent
Yeung et al.

(10) Patent No.: US 12,141,081 B2
(45) Date of Patent: *Nov. 12, 2024

(54) TRAINING AND OPERATIONS WITH A DOUBLE BUFFERED MEMORY TOPOLOGY

(71) Applicant: Rambus Inc., San Jose, CA (US)

(72) Inventors: Chi-Ming Yeung, Cupertino, CA (US); Yoshie Nakabayashi, Tokyo (JP); Thomas Giovannini, San Jose, CA (US); Henry Stracovsky, Portland, OR (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,272

(22) Filed: Aug. 21, 2023

(65) Prior Publication Data

US 2024/0045813 A1    Feb. 8, 2024

Related U.S. Application Data

(63) Continuation of application No. 17/710,578, filed on Mar. 31, 2022, now Pat. No. 11,768,780, which is a continuation of application No. 16/837,689, filed on Apr. 1, 2020, now Pat. No. 11,294,830, which is a continuation of application No. 15/071,048, filed on Mar. 15, 2016, now Pat. No. 10,613,995.

(60) Provisional application No. 62/218,466, filed on Sep. 14, 2015, provisional application No. 62/173,134, filed on Jun. 9, 2015, provisional application No. 62/133,781, filed on Mar. 16, 2015.

(51) Int. Cl.
*G06F 13/16* (2006.01)
*G11C 5/02* (2006.01)
*G11C 5/04* (2006.01)
*G11C 7/10* (2006.01)
*H03K 19/1778* (2020.01)

(52) U.S. Cl.
CPC ............ *G06F 13/16* (2013.01); *G11C 5/02* (2013.01); *G11C 5/04* (2013.01); *G11C 7/10* (2013.01); *H03K 19/1778* (2013.01)

(58) Field of Classification Search
CPC .. G06F 13/16; G11C 5/02; G11C 5/04; G11C 7/10; H03K 19/1778
See application file for complete search history.

(56) References Cited

U.S. PATENT DOCUMENTS

| | | |
|---|---|---|
| 6,329,997 B1 | 12/2001 | Wu et al. |
| 6,530,006 B1 | 3/2003 | Dodd et al. |
| 6,686,763 B1 * | 2/2004 | Yen ............ H03K 19/0013 326/26 |
| 6,862,653 B1 * | 3/2005 | Dodd ............... G06F 13/1673 710/310 |
| 10,613,995 B2 * | 4/2020 | Yeung ................ G06F 13/16 |
| 11,294,830 B2 * | 4/2022 | Yeung ................ G06F 13/16 |

(Continued)

*Primary Examiner* — Phong H Dang
(74) *Attorney, Agent, or Firm* — Lowenstein Sandler LLP

(57) ABSTRACT

System and method for training and performing operations (e.g., read and write operations) on a double buffered memory topology. In some embodiments, eight DIMMs are coupled to a single channel. The training and operations schemes are configured with timing and signaling to allow training and operations with the double buffered memory topology. In some embodiments, the double buffered memory topology includes one or more buffers on a system board (e.g., motherboard).

20 Claims, 27 Drawing Sheets

(56) References Cited

U.S. PATENT DOCUMENTS

| | | |
|---|---|---|
| 2002/0129215 A1 | 9/2002 | Yoo et al. |
| 2005/0204091 A1 | 9/2005 | Kilbuck et al. |
| 2006/0161745 A1 | 7/2006 | Lee et al. |
| 2006/0179183 A1* | 8/2006 | Brittain .................. G06F 13/28 710/35 |
| 2007/0140025 A1 | 6/2007 | Chan et al. |
| 2008/0279031 A1 | 11/2008 | Kwon et al. |
| 2009/0094412 A1* | 4/2009 | Markevitch ............ G06F 13/16 711/E12.001 |
| 2009/0122634 A1 | 5/2009 | Kang |
| 2010/0003837 A1* | 1/2010 | Loughner ................ G11C 5/04 439/64 |
| 2010/0162037 A1 | 6/2010 | Maule et al. |
| 2012/0159093 A1 | 6/2012 | Morein et al. |
| 2014/0153344 A1 | 6/2014 | Kim |
| 2015/0016195 A1 | 1/2015 | Yu et al. |
| 2015/0378956 A1* | 12/2015 | Dearth ................ G06F 13/4234 710/308 |
| 2016/0217086 A1 | 7/2016 | Shan et al. |

* cited by examiner

TRAINING AND OPERATIONS WITH A DOUBLE BUFFERED MEMORY TOPOLOGY

CROSS REFERENCE TO RELATED APPLICATIONS

This application is a continuation of U.S. patent application Ser. No. 17/710,578, filed Mar. 31, 2022, which is a continuation of U.S. patent application Ser. No. 16/837,689, filed Apr. 1, 2020, now U.S. Pat. No. 11,294,830, issued Apr. 5, 2022, which is a continuation of U.S. patent application Ser. No. 15/071,048, filed Mar. 15, 2016, now U.S. Pat. No. 10,613,995, issued Apr. 7, 2020, which claims the benefit of U.S. Provisional Patent Application No. 62/218,466, filed Sep. 14, 2015, and claims the benefit of U.S. Provisional Application No. 62/173,134, filed Jun. 9, 2015, and claims the benefit of U.S. Provisional Patent Application No. 62/133,781, filed Mar. 16, 2015, each of which is hereby incorporated in its entirety herein by reference.

BACKGROUND

Increasingly, information is stored and processed in large data storage systems. At a base level, these data storage systems are configured with large amounts of memory to support the processing of the large amounts of data. However, the current designs limit the amount of memory that can be used by these systems.

BRIEF DESCRIPTION OF THE DRAWINGS

Further aspects of the present disclosure will become apparent from the following description which is given by way of example only and with reference to the accompanying drawings in which.

DETAILED DESCRIPTION

Reference will now be made in detail to the various embodiments of the present disclosure, examples of which are illustrated in the accompanying drawings. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The FIGS. illustrate example components used by various embodiments. Although specific components are disclosed in the FIGS., it should be appreciated that such components are exemplary. That is, embodiments are well suited to having various other components or variations of the components recited in the FIGS. It is appreciated that the components in the FIGS. may operate with other components than those presented, and that not all of the components of the FIGS. are required to achieve the goals of embodiments.

Figure 1:
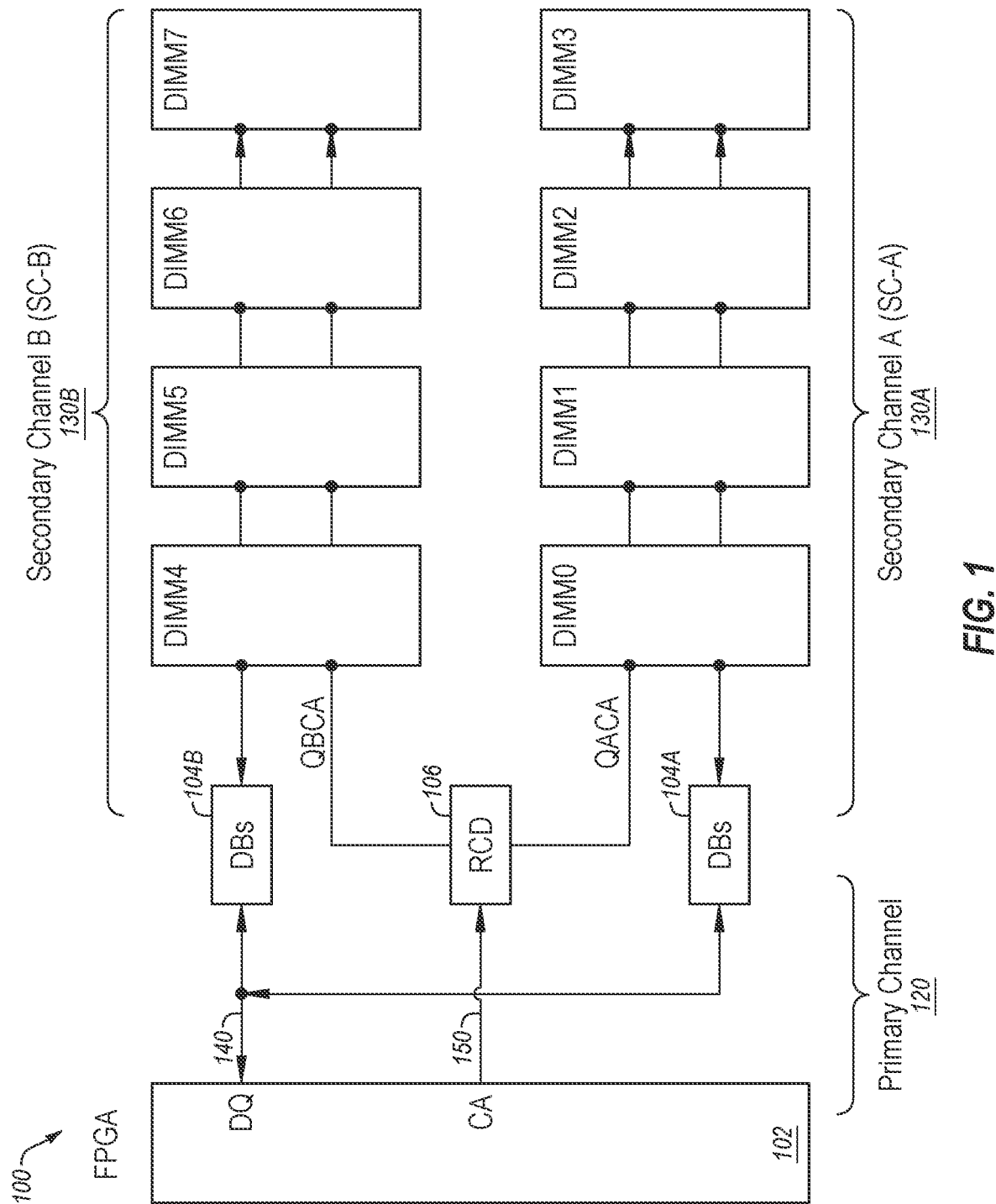
FIG. 1 shows a memory topology with a double buffering configuration, in accordance with various embodiments.

FIG. 1 shows a memory topology with a double buffering configuration, in accordance with various embodiments. FIG. 1 depicts components and associated couplings of a memory topology 100 with buffers coupled between a memory controller and a memory components. The memory topology 100 includes a memory controller 102, a data (DQ) bus 140, a command/address (CA) bus 150, sets of data buffers 104A-B, a registered clock driver (RCD) 106, and dual in-line memory modules (DIMMs) 0-7.

The memory topology 100 includes a primary channel 120 and secondary channels 130A-B. In some embodiments, each of the primary channel 120 and secondary channels 130A-B have respective T topologies to support signal integrity for signaling of the associated memory modules. The primary channel 120 includes a portion of the CA bus 150 with a point to point coupling of the memory controller 102 to the RCD 106. The RCD 106 buffers command/address signals out to the DIMMs 0-7. The primary channel 120 further includes a portion of the data bus 140 with a balanced T topology coupling the memory controller 102 with the sets of data buffers 104A-B. The secondary channels 130A-B include a portion of the CA bus 150 with a fly-by topology coupling of the RCD 106 to a first set of four memory modules and a second set of four memory modules. The secondary channels 130A-B further includes a portion of the data bus 140 with a fly-by topology coupling of the sets of data buffers 104A-B to a first set of four memory modules and a second set of four memory modules. Embodiments are capable of supporting one, two, or more memory modules.

In some embodiments, the DIMMs 4-7 are coupled to the set of data buffers 104B, the data bus 140, the memory controller 102, RCD 106, and the CA bus 150. The DIMMs 0-3 are coupled to the set of data buffers 104A, the data bus 140, the memory controller 102, RCD 106, and the CA bus 150.

The memory controller 102 drives the sets of data buffers 104A-B. In some embodiments, the sets of data buffers 104A-B are on a motherboard. In some embodiments, the RCD 106 is on the motherboard. Each set of data buffers 104A-B drives four of DIMMs of DIMMs 0-7. Embodiments can support the use of standard DIMMs and buffers. In some embodiments, the memory topology 100 can provide data transfer rates of 1.3-1.6 gigatransfers per second (GT/s). In some embodiments, DIMMs 0-7 are double data rate fourth generation (DDR4) DIMMs. The memory topology 100 is shown supporting eight DIMMs per channel. The DIMMs 0-7 can have up to eight or more ranks per DIMM.

In some embodiments, the DIMMs 0-7 may be a variety of different types of memory modules including, but not limited to, Unbuffered DIMMs (UDIMMs), Small Outline DIMMs (SODIMMs), Registered DIMMs (RDIMMs), Small Outline Registered DIMMs (SORDIMMs), Load-Reduced DIMMs (LRDIMMs), Fully Buffered DIMMs (FBDIMMs), Very Low Profile Registered DIMMs (VLP RDIMMs), Very Low Profile Unbuffered DIMMs (VLP UDIMMs), Mini Registered DIMMs (Mini-RDIMMs), Mini Unbuffered DIMMs (Mini-UDIMMs), Very Low Profile Mini Registered DIMMs (VLP Mini-RDIMMs), Very Low Profile Mini Unbuffered DIMMs (VLP Mini-UDIMMs), Non-Volatile DIMMs (NVDIMMs), Non-Volatile Memory (NVM) modules, Storage Class Memory (SCM) modules, etc. The DIMMs 0-7 may further include flash memory. For example, DIMM 1 may include flash memory module with a DDR4 memory interface for memory controller communication.

In some embodiments, the DIMMs 0-7 may be replaced with DRAMs that are the coupled directly to a circuit board, e.g., motherboard, where DBs 104A-B and RCD 106 are directly coupled. The DRAMs may be used in place of DIMMs 0-7 and the DRAMs are communicatively coupled to the data buffers 104A-B and the RCD 106. For example, the DRAMs may be soldered directly to the motherboard. The DRAMs may not be removable from the motherboard. The attachment of the DRAMs to the motherboard may allow additional form factors and adjustment in size of the motherboard and/or system.

Figure 2:
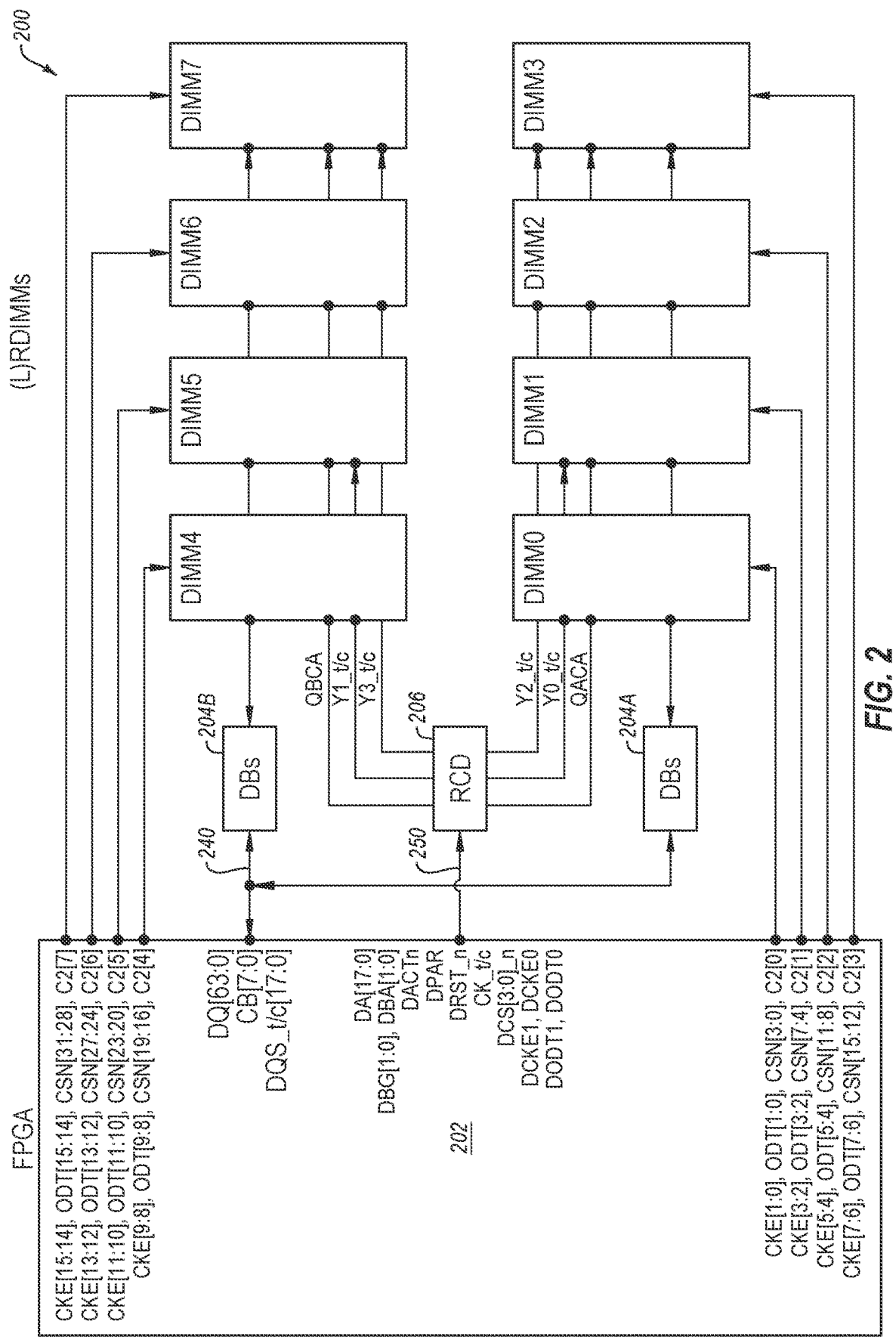
FIG. 2 shows exemplary signals associated with a double buffered memory topology, in accordance with various embodiments.

FIG. 2 shows exemplary signals associated with a double buffered memory topology, in accordance with various embodiments. FIG. 2 depicts exemplary data, command/address, and control couplings of a memory topology 200 with a double buffering configuration. The memory topology 200 includes a memory controller 202, a data (DQ) bus 240, a command/address bus 250, sets of data buffers 204A-B, a primary RCD 206, and DIMMs 0-7.

In some embodiments, the sets of data buffers 204A-B are located on a motherboard and are between the memory controller 202 and an associated portion of DIMMs 0-7. For example, the set of data buffers 204A drives the DIMMs 0-3 and the set of data buffers 204B drives the DIMMs 4-7.

In some embodiments, the primary RCD 206 is located on a motherboard and is between the memory controller 202 and associated portions of DIMMs 0-7. For example, the primary RCD 206 has address bus outputs that drive four memory modules each and the primary RCD 206 has a plurality of clock outputs that drive two memory modules each.

The memory controller 202 is configured to send clock enable (CKE) signals, on-die termination (ODT) signals, chip select (CSN) signals (e.g., active low chip select signals), and chip ID (C2) signals to DIMMs 0-7. The memory controller 202 is further configured to send data (DQ) signals, check bit (CB) signals, data strobe (DQS_t/c) signals. In some embodiments, the CKE, ODT, CSN, and C2 signals are sent via a point to point (P2P) connection.

The memory controller 202 is further configured to send address (DA), bank group (DBG), bank address (DBA), activation (DACTn), command and address parity (DPAR), DRAM reset (DRST_n), clock (CK_t/c), chip select (DCS_n), clock enable 1 (DCKE1), clock enable 0 (DCKE0), on-die termination 1 (DODT1), and on-die termination 0 (DODT0) signals.

Figure 3:
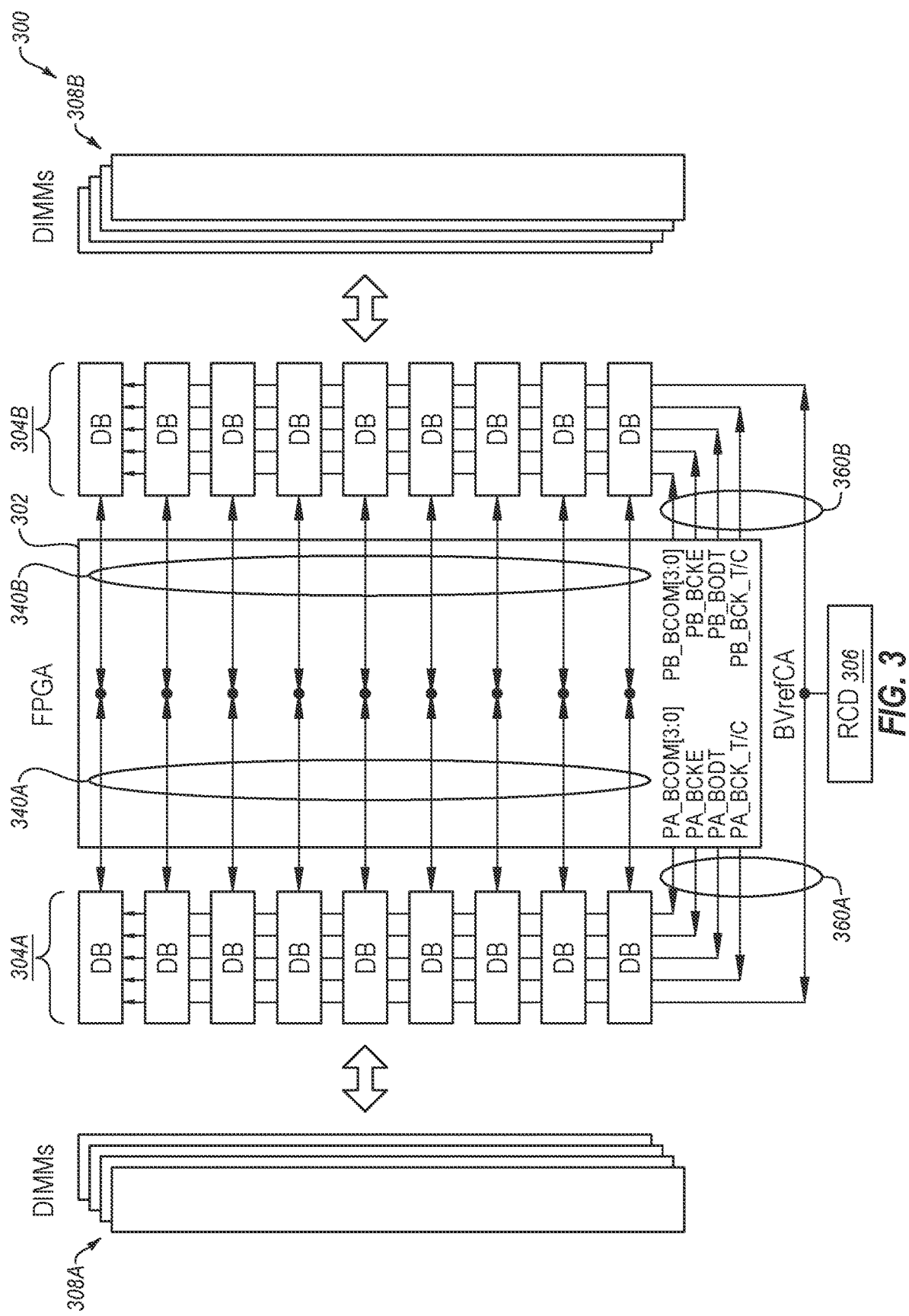
FIG. 3 shows an exemplary address and control bus configuration, in accordance with various embodiments.

FIG. 3 shows exemplary data buffer control couplings, in accordance with various embodiments. FIG. 3 depicts exemplary data buffer control signaling couplings of a memory topology 300 with a double buffering configuration. The memory topology 300 includes a memory controller 302, sets of data (DQ) buses 340A-B, sets of data buffers 304A-B, a RCD 306, and sets of DIMMs 308A-B.

The data buffer control signals 360A-B includes buffer reference voltage (BVREFCA). In some embodiments, the RCD 306 provides the BVREFCA signal to eighteen data buffers of the sets of data buffers 304A-B.

The data buffer control signals 360A include a first set of data buffer signals for the set of data buffers 304A of a buffer command (BCOM) (PA_BCOM[3:0]), buffer clock enable (PA_BCKE), buffer on-die termination (PA_BODT), and buffer clock (PA_BCK_T/C). In some embodiments, the memory controller 302 directly controls the data buffer control signals 360A-B with the BCOM bus.

The data buffer control signals 360B include a second set of data buffer signals for the set of data buffers 306B of a buffer command (PB_BCOM[3:0]), buffer clock enable (PB_BCKE), buffer on-die termination (PB_BODT), and buffer clock (PB_BCK_T/C).

In some embodiments, the data buffer control signals 360A-B are sent on respective direct connections from the memory controller 302 to the sets of data buffers 304A-B as shown in FIG. 3. The data buffer buses can be configured in a fly-by topology. In some embodiments, there are two separate data buffer buses which control two groups of nine data buffers independently. For example, while data buffers of the set of data buffers 304A are performing a read operation, the data buffers of the set of data buffers 304B can keep their respective driver disabled and the on-die termination enabled.

Figure 4:
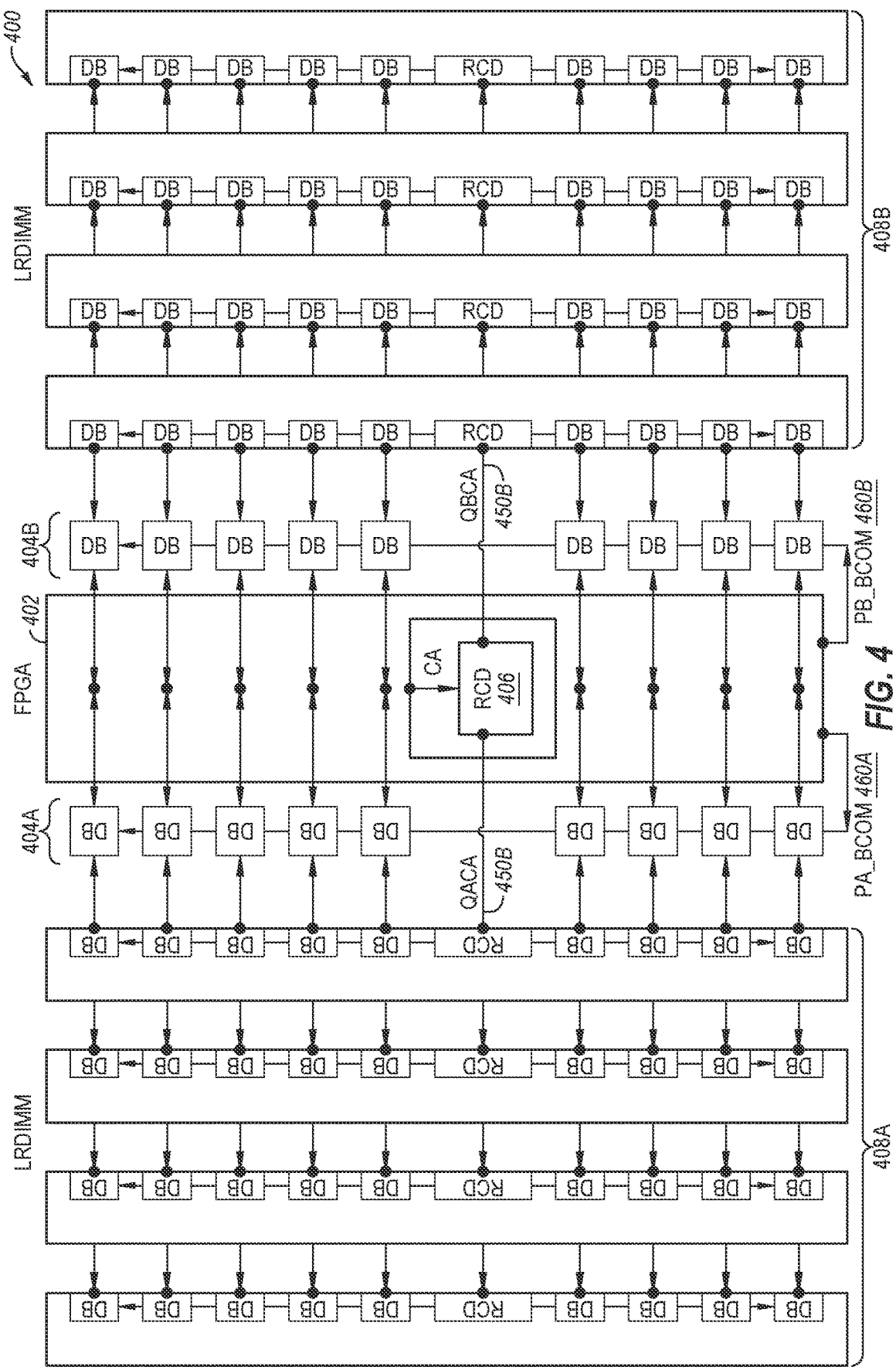
FIG. 4 shows exemplary components and associated coupling of a memory topology with a double buffering configuration, in accordance with various embodiments.

FIG. 4 shows exemplary components and associated coupling of a memory topology with a double buffering configuration, in accordance with various embodiments. FIG. 4 depicts an exemplary memory topology 400 and couplings to various components of sets of memory modules 408A-B and a memory controller 402. The memory topology 400 includes a memory controller 402, sets of memory modules 408A-B, sets of data buffers 404A-B, CA buses 450A-B, and buffer control buses 460A-B. The memory controller 402 can be a field-programmable gate array (FPGA), a processor, an Application-Specific Integrated Circuit (ASIC), etc.

The memory controller 402 is coupled with a RCD 406 that is coupled via command/address busses 450A-B to respective RCDs in each of the memory modules of the sets of memory modules 408A-B.

Each of the data buffers of the sets of data buffers 404A-B are coupled by respective data busses to memory controller 402. In some embodiments, each of the sets of memory modules 408A-B include four memory modules. In some embodiments, the sets of memory modules 408A-B are RDIMMs or LRDIMMs. As shown, the LRDIMMs include data buffers which are each coupled with their own connection to a respective data buffer of the sets of data buffers 408A-B. For example, each of data buffers of a particular memory module of the set of memory modules 408A is coupled to each of the data buffers of the set of data buffers 404A. The data buffers of the memory modules and the data buffers of the sets of data buffers 404A-B form a double buffered path between memory controller 402 and the memory storage components (e.g., DRAM) of the memory modules. Each of the data buffers of the sets of data buffers 404A-B are coupled by a respective coupling to the buffer control buses 460A-B.

In some embodiments, the data buffers of the sets of data buffers 404A-B are configured to support per rank delay adjustment of up to four ranks. The data buffers of the sets of data buffers 404A-B can switch the delays for four data buffers on each of four memory modules. The memory controller 402 can be configured to support per rank delay adjustment of two or more ranks. The memory controller 402 can switch the delay for two data buffers.

Figure 5:
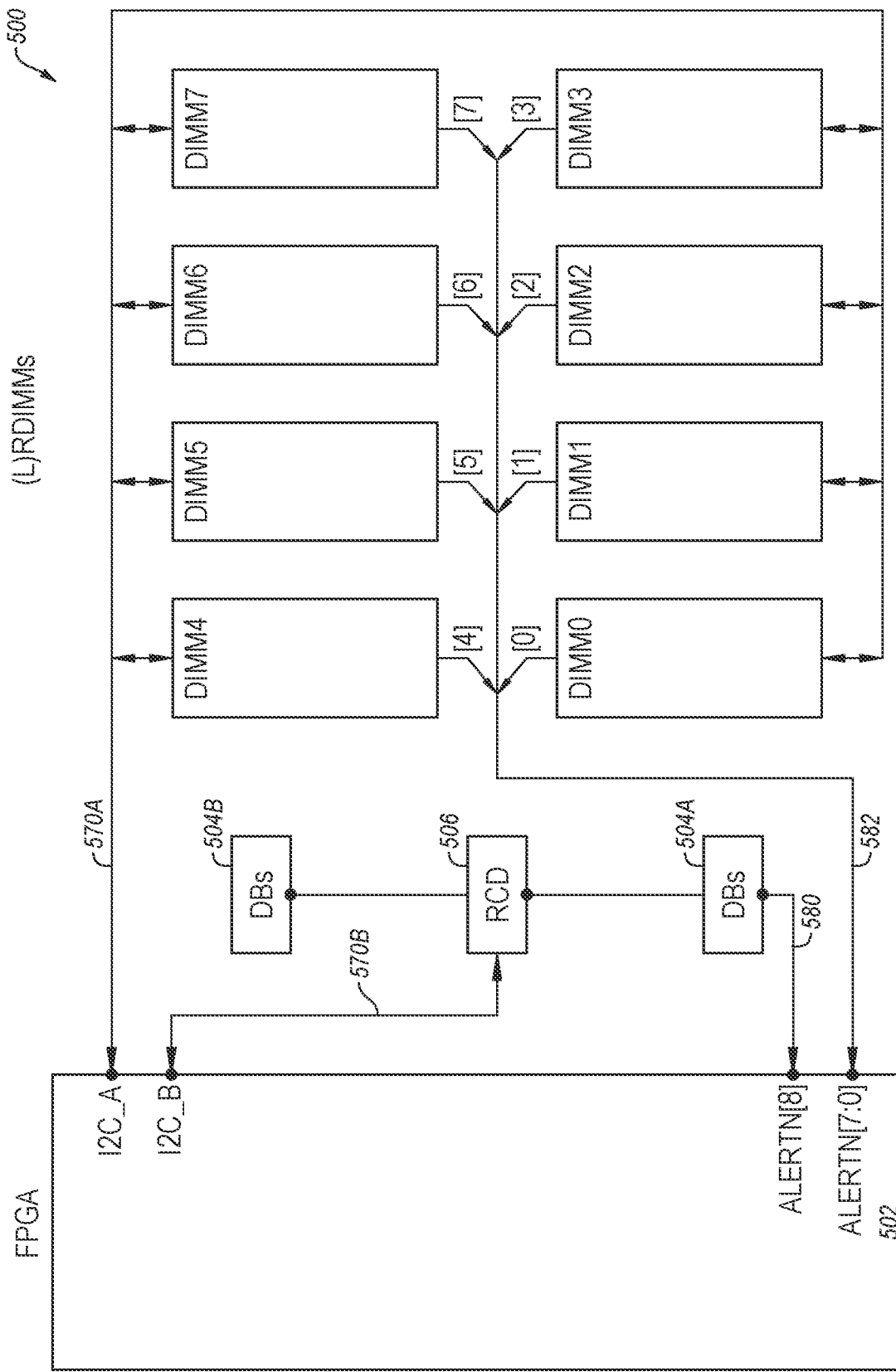
FIG. 5 shows an exemplary serial communication bus and alert components of a memory topology with a double buffering configuration, in accordance with various embodiments.

FIG. 5 shows exemplary serial communication bus and alert components of a memory topology with a double buffering configuration, in accordance with various embodiments. FIG. 5 depicts exemplary memory topology 500 with exemplary serial communication and alert buses. The memory topology 500 includes a memory controller 502, an RCD 506, sets of data buffers 504A-B, serial communication buses 570A-B, alert buses 580-582, and sets of memory modules DIMMs 0-7. The exemplary serial communication and alert buses allow communication with the RCD 506 and with the DIMMs 0-7. The exemplary serial communication and alert buses can be used for configuration and reporting of DIMM problems and error isolation issues.

The serial communication bus 570A couples the memory controller 502 to DIMMs 0-7. The serial communication bus 570B couples the memory controller 502 to the RCD 506. The serial communication buses 570A-B provide access to registers in the RCD 506 and DIMMs 0-7. In some embodiments, the serial communication buses 570A-B use the inter-integrated circuit ($I^2C$) bus or System Management Bus (SMbus) standards.

The alert bus 580 couples the RCD 506 and the data buffers 504A-B to the memory controller 502. The alert bus 580 is configured for reporting or signaling of error conditions by the data buffers 504A-B and the RCD 506. The alert bus 582 couples the DIMMS 0-7 to the memory controller 502. The alert bus 582 is configured for reporting or signaling of error conditions by the DIMMs 0-7. The alert buses 580-582 provide a direct connection to the memory controller 502 for error isolation and can be used for training or initialization of communications with DIMMs 0-7.

In some embodiments, the memory controller 502 may thus have approximately 100 signals pins or more in addition to the standard DDR4 single channel interface. For example, there are 72 pins for the control signals on a per memory module basis (e.g., (CSN[3:0]+CKE[1:0]+ODT[1:0]+C2)×8 DIMMs). Two pins of the memory controller 502 may be coupled to the serial communication buses (e.g., SCL and SDA). Sixteen pins of the memory controller 502 may be coupled to the buffer command bus (e.g., (BCK_T/C+BCOM[3:0]+BCKE+BODT)×2). Nine pins of the memory controller 502 may be coupled to the alert bus. The memory controller 502 may have a pin for a separate reset for an RCD (e.g., RCD 506) on the motherboard.

Figure 6:
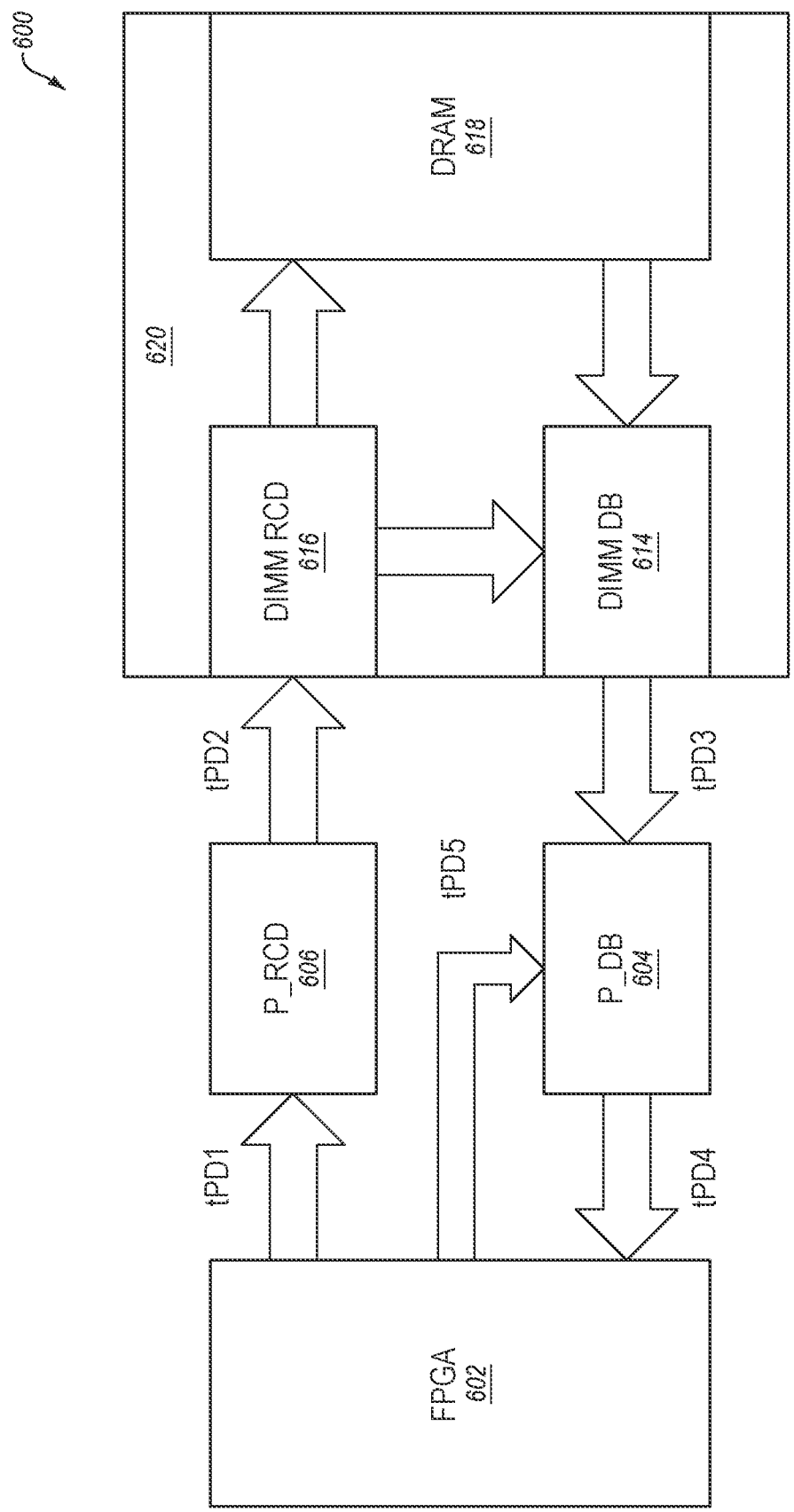
FIG. 6 shows exemplary communications for a read operation of a memory topology with a double buffering configuration having load reduced dual in-line memory modules (LRDIMMs), in accordance with various embodiments.

FIG. 6 shows exemplary communications for a read operation of a memory topology with a double buffering configuration having load reduced dual in-line memory modules (LRDIMMs), in accordance with various embodiments. FIG. 6 depicts exemplary communications within a system 600 of a memory controller 602, a primary RCD 606, a memory module 620, and primary data buffers 604 with timing configured for performing a read operation. The memory controller 602 is coupled to the primary RCD 606 and the memory module 620 via a command/address bus. The memory controller 602 is coupled to the primary data buffers 604 and the memory module 620 via a data bus. The memory controller 602 is coupled to the primary data buffers 604 via control buses (e.g., for transmission of data buffer control signals 360A-B). It is noted that the primary data buffers 604 and the DIMM data buffers (DB) 614 represent multiple buffers (e.g., as shown in FIG. 4). In some embodiments, the memory controller 602 is an FPGA.

The memory controller 602 sends a read command and an address to the primary RCD 606 with a time delay of tPD1. The memory controller 602 signals the primary data buffers 604 with a time delay of tPD5 (e.g., using the BCOM bus). The primary RCD 606 sends the read command and the address to a DIMM RCD 616 of the memory module 620 with a time delay of tPD2. The DIMM RCD 616 sends appropriate portions of the read command and the address to the DRAM 618 and DIMM DB 614 of the memory module 620. The DIMM DB 614 receives data in response to the read command from the DRAM 618. The DIMM DB 614 sends the data to the primary data buffers 604 with a delay of tPD3. The primary data buffers 604 send the data to the memory controller 602 with a time delay of tPD4. The memory controller is configured to enable capture of the data signal to complete the read operation. The timing delays of tPD1, tPD2, tPD3, tPD4, and tPD5 are configured to allow operation of communications with the double buffered memory topology.

Figure 7:
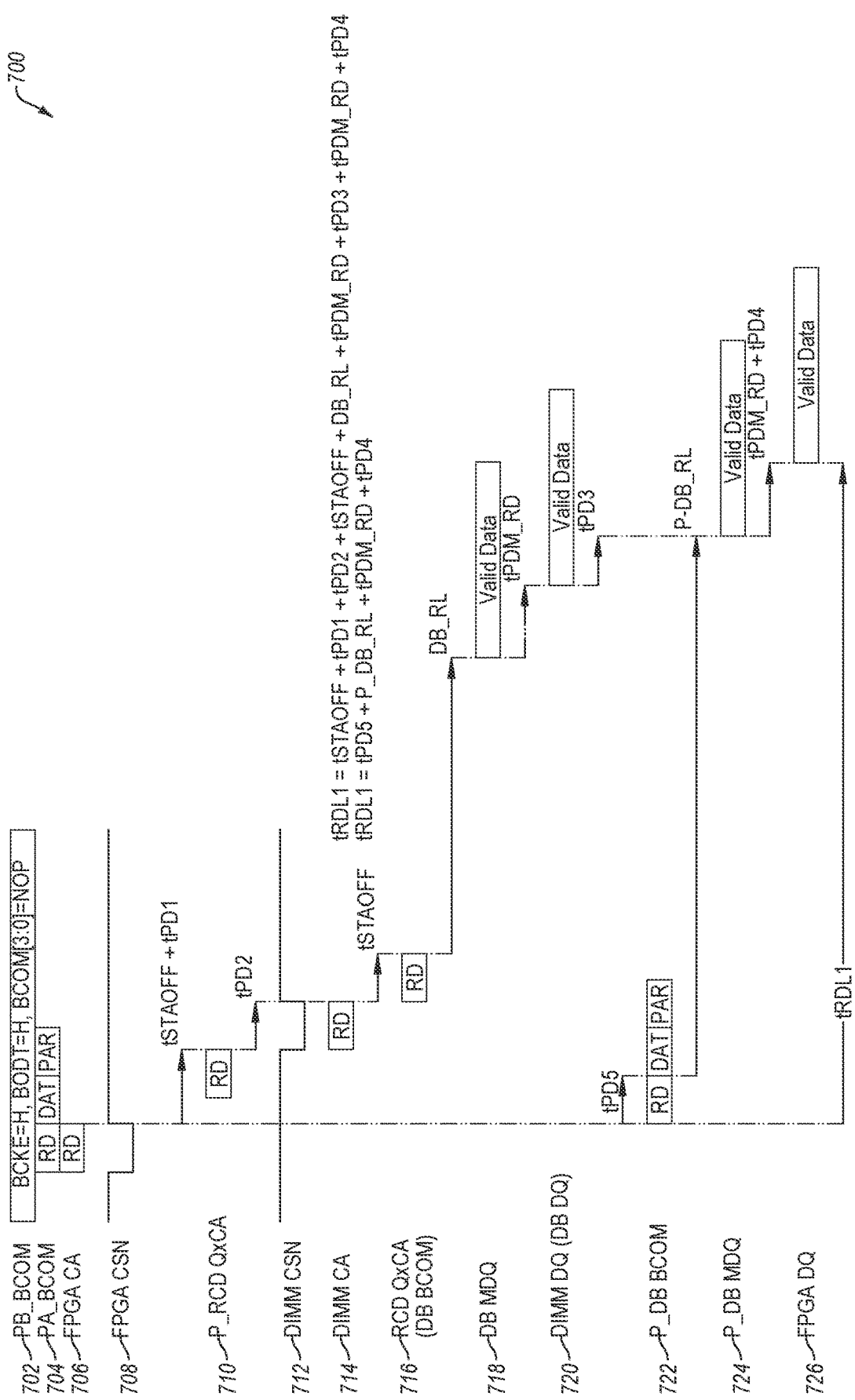
FIG. 7 shows an exemplary timing diagram for a read operation of a memory topology with a double buffering configuration having LRDIMMs, in accordance with various embodiments.

FIG. 7 shows an exemplary timing diagram 700 for a read operation of a memory topology with a double buffering configuration having LRDIMMs, in accordance with various embodiments. FIG. 7 depicts timing of signals for the exemplary read operation shown in FIG. 6.

The PB_BCOM diagram 702 represents a BCOM signal for a portion of a plurality of data buffers (e.g., FIGS. 3-4). The PA_BCOM diagram 704 represents a BCOM signal for another portion of the plurality of data buffers (e.g., FIGS. 3-4). The FPGA CA diagram 706 represents a command/address signal. The FPGA CSN diagram 708 represents a chip select signal (e.g., active low chip select signal). The primary RCD (P_RCD) QxCA diagram 710 represents a command/address signal driven by a primary RCD. The DIMM CSN diagram 712 represents a memory module chip select signal (e.g., active low chip select signal). The DIMM CA diagram 714 represents a memory module command/address signal. The RCD QxCA (DB BCOM) diagram 716 represents a command/address signal driven by an RCD of a memory module. The DB MDQ diagram 718 represents a data signal of a DRAM of a memory module. The DIMM DQ (DB DQ) diagram 720 represents a data signal driven by a data buffer of a memory module. The primary data buffer (P_DB) BCOM diagram 722 represents a BCOM signal to one or more primary data buffers. The P_DB MDQ diagram 724 represents a data signal at one or more primary data buffers. The FPGA DQ diagram 726 represents a data signal at a memory controller.

The timing diagram 700 includes exemplary signals for a single column access to a rank in secondary channel (e.g., SC-A 130A). The memory controller can send two read commands. A first read command is sent on a command/address bus (e.g., FPGA CA). A second read command is send on a first BCOM bus (e.g., PA_BCOM). A no operation (NOP) is sent on a second BCOM bus (e.g., PB_BCOM). A time delay of tPD1+tSTAOFF+tPD2 later, the CSN signal arrives at the RCD of the memory module (e.g., DIMM). The DRAM of the memory module can receive the CSN signal after a time delay of tSTAOFF. The DIMM DB can receive the read command at the same time the DRAM receives the CSN signal. The DIMM DB can receive the DRAM data DB_RL later. The DIMM DB can send the data to the primary data buffers tPDM_RD later. The primary data buffers of one secondary channel (e.g., SC-A 130A) receive the read data with an optimized latency (e.g., P_DB_RL). The primary data buffers send the data to the memory controller tPDM_RD later. The primary data buffers in another secondary channel (e.g., SC-B 130B) keep the data (DQ) driver disabled so that no data conflict occurs.

Figure 8:
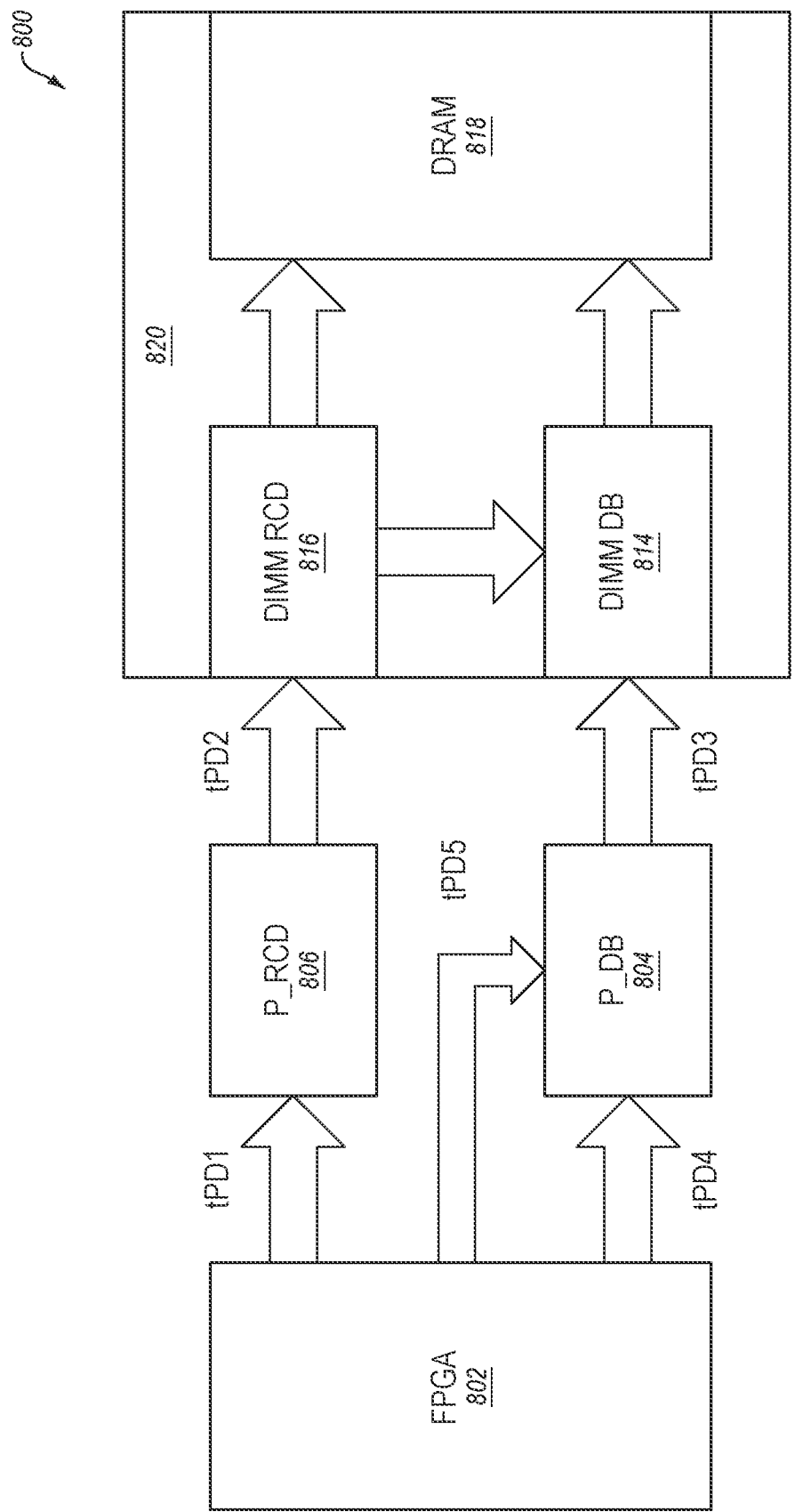
FIG. 8 shows exemplary communications for a write operation of a memory topology with a double buffering configuration having LRDIMMs, in accordance with various embodiments.

FIG. 8 shows exemplary communications for a write operation of a memory topology with a double buffering configuration having LRDIMMs, in accordance with various embodiments. FIG. 8 depicts exemplary communications within a system 800 including a memory controller 802, a primary RCD 806, a memory module 820, and primary data buffers 804. The memory controller 802 is coupled to the primary RCD 806 and the memory module 820 via a command/address bus. The memory controller 802 is coupled to the primary data buffers 804 and the memory module 820 via a data bus. The memory controller 602 is coupled to the primary data buffers 604 via control buses (e.g., for transmission of data buffer control signals 360A-B). It is noted that the primary data buffers 804 and the DIMM data buffers (DB) 814 represent multiple buffers (e.g., as shown in FIG. 4). In some embodiments, the memory controller 802 is an FPGA.

The memory controller 802 sends a write command and an address to the primary RCD 806 with a time delay of tPD1. The memory controller 802 signals the primary data buffers 804 with a time delay of tPD5. The primary data buffers 804 receive data from the memory controller 802 with a time delay of tPD4. The primary RCD 806 sends the write command and the address to a DIMM RCD 816 of the memory module 820 with a time delay of tPD2. The DIMM RCD 816 sends appropriate portions of the write command and the address to the DRAM 818 and DIMM DB 814 of the memory module 820. The DIMM DB 814 receives data from the primary data buffers 804 with a delay of tPD3. The DIMM DB 814 sends the data to DRAM 818 of the memory module 820. The timing delays of tPD1, tPD2, tPD3, tPD4, and tPD5 are configured to allow operation of communications with the double buffered memory topology.

Figure 9:
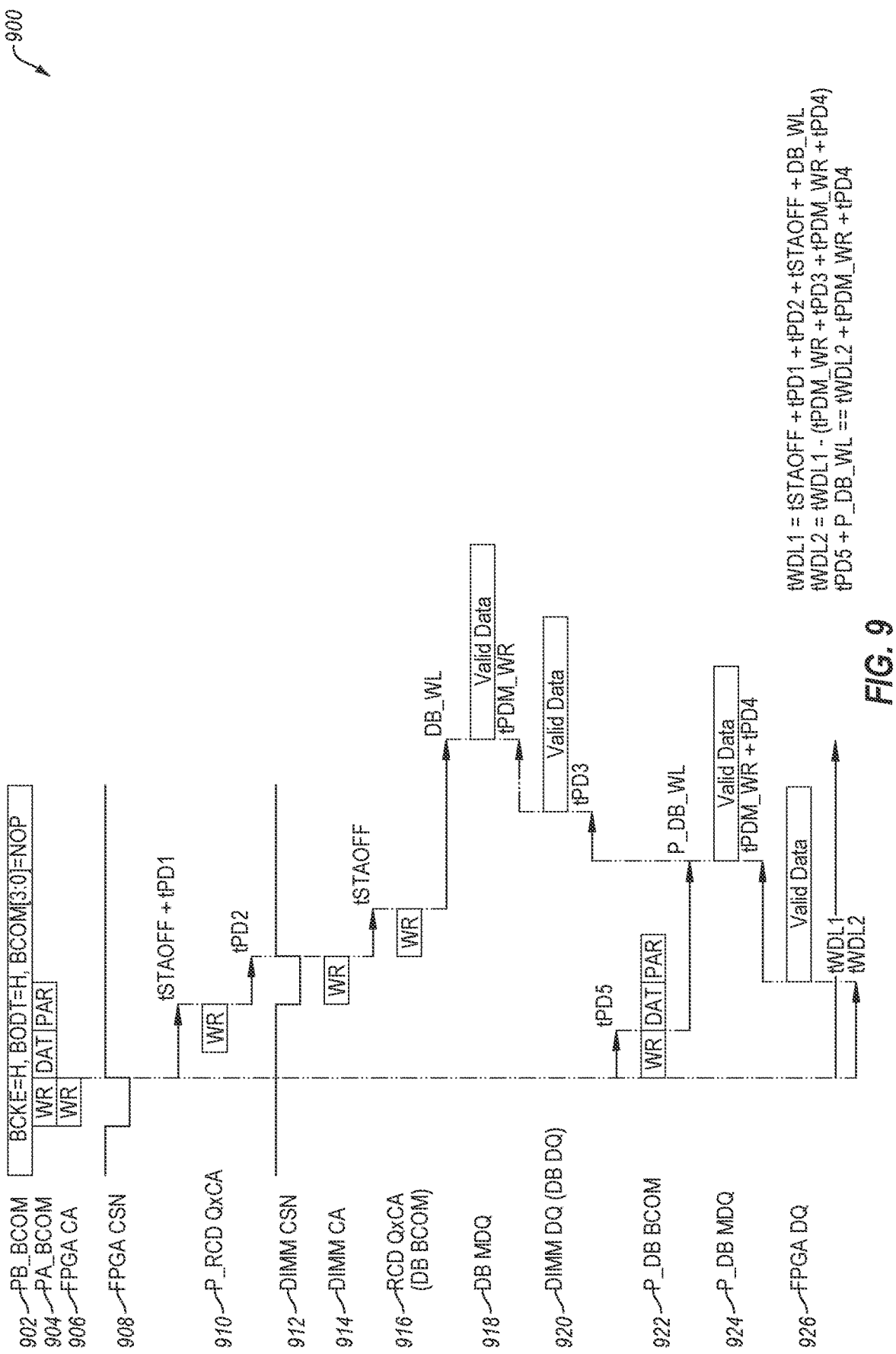
FIG. 9 shows an exemplary timing diagram for a write operation of a memory topology with a double buffering configuration having LRDIMMs, in accordance with various embodiments.

FIG. 9 shows an exemplary timing diagram 900 for a write operation of a memory topology with a double buffering configuration having LRDIMMs, in accordance with various embodiments. FIG. 9 depicts timing of signals for the exemplary write operation shown in FIG. 8.

The PB_BCOM diagram 902 represents a BCOM signal for a portion of a plurality of data buffers (e.g., FIGS. 3-4). The PA_BCOM diagram 904 represents a BCOM signal for another portion of the plurality of data buffers (e.g., FIGS. 3-4). The FPGA CA diagram 906 represents a command/address signal. The FPGA CSN diagram 908 represents a chip select signal (e.g., active low chip select signal). The P_RCD QxCA diagram 910 represents a command/address signal driven by a primary RCD. The DIMM CSN diagram 912 represents a memory module chip select signal (e.g., active low chip select signal). The DIMM CA diagram 914 represents a memory module command/address signal. The RCD QxCA (DB BCOM) diagram 916 represents a command/address signal driven by a RCD of a memory module. The DB MDQ diagram 918 represents a data signal of a DRAM of a memory module. The DIMM DQ (DB DQ) diagram 920 represents a data signal received by a data buffer of a memory module. The P_DB BCOM diagram 922 represents a BCOM signal to one or more primary data buffers. The P_DB MDQ diagram 924 represents a data signal at one or more primary data buffers. The FPGA DQ diagram 926 represents a data signal at a memory controller.

The timing diagram 900 includes exemplary signals for a single column access to a rank in secondary channel (e.g., SC-A 130A). The memory controller can send two write commands. A first write command is sent on a command/address bus (e.g., FPGA CA). A second write command is send on a first BCOM bus (e.g., PA_BCOM). A no operation (NOP) is sent on a second BCOM bus (e.g., PB_BCOM). A time delay of tPD1+tSTAOFF+tPD2 later, the CSN signal arrives at the RCD of the memory module (e.g., DIMM). The DRAM of the memory module receives the CSN signal tSTAOFF later. The DIMM DB can receive the command at the same time. The primary data buffer of one secondary channel (e.g., SC-A 130A) transfers the write data with an optimized latency (e.g., P_DB_WL). The DIMM DB can receive data from the memory controller DB_RL-tPDM_WR earlier. The DIMM DB sends the data to the DRAM tPDM_WR later. The primary data buffers in another secondary channel (e.g., SC-B 130B) keep the data (DQ) driver disabled so that no data conflict occurs.

Figure 10:
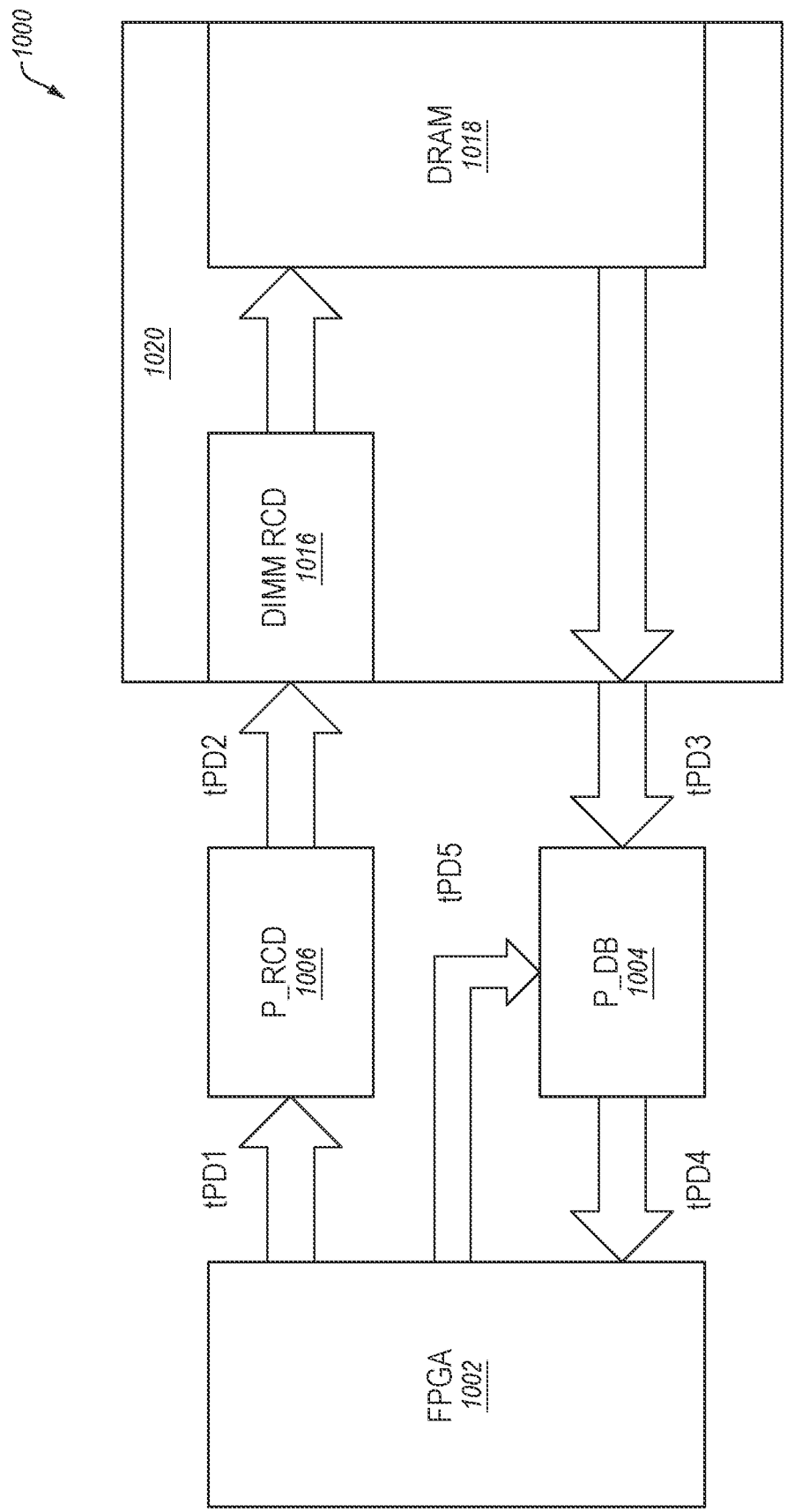
FIG. 10 shows exemplary communications for a read operation of a memory topology with a double buffering configuration having registered dual in-line memory modules (RDIMMs), in accordance with various embodiments.

FIG. 10 shows exemplary communications for a read operation of a memory topology with a double buffering configuration having registered dual in-line memory modules (RDIMMs), in accordance with various embodiments. FIG. 10 depicts exemplary communications within a system 1000 including a memory controller 1002, a primary RCD 1006, a memory module 1020, and primary data buffers 1004. The memory controller 1002 is coupled to the primary RCD 1006 and the memory module 1020 via a command/address bus. The memory controller 1002 is coupled to the primary data buffers 1004 and the memory module 1020 via a data bus. The memory controller 1002 is coupled to the primary data buffers 1004 via control buses (e.g., for transmission of data buffer control signals 360A-B). It is noted that the primary data buffers 1004 represent multiple buffers (e.g., as shown in FIG. 4). In some embodiments, the memory controller 1002 is an FPGA.

The memory controller 1002 sends a read command and an address to the primary RCD 1006 with a time delay of tPD1. The memory controller 1002 signals the primary data buffers 1004 with a time delay of tPD5. The primary RCD 1006 sends the read command and the address to a DIMM RCD 1016 of the memory module 1020 with a time delay of tPD2. The DIMM RCD 1016 sends the read command and the address to the DRAM 1018 of the memory module 1020. The DRAM 1018 sends the data to the primary data buffers 1004 with a delay of tPD3. The primary data buffers 1004 send the data to the memory controller 1002 with a time delay of tPD4. The timing delays of tPD1, tPD2, tPD3, tPD4, and tPD5 are configured to allow operation of communications with the double buffered memory topology.

Figure 11:
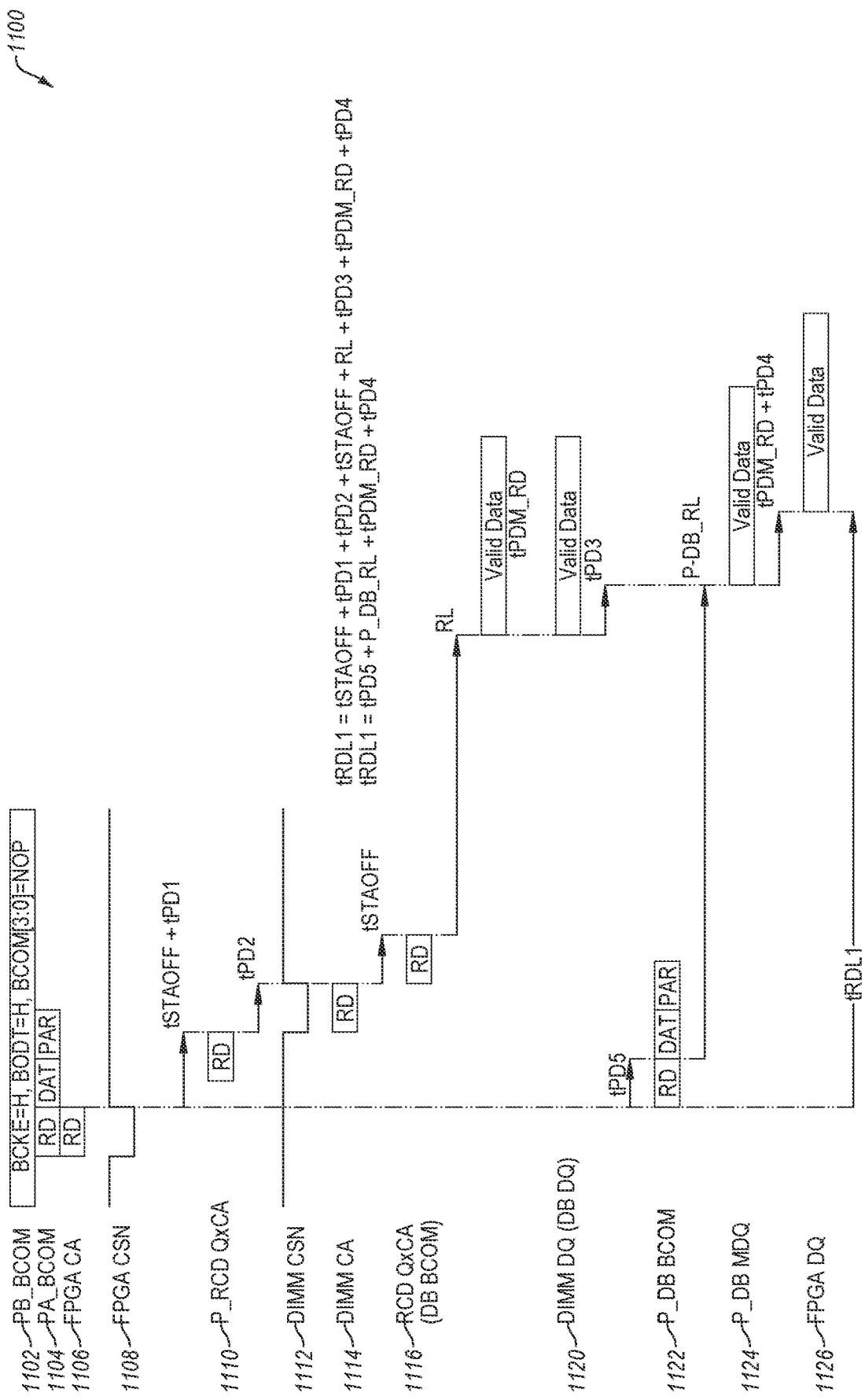
FIG. 11 shows an exemplary timing diagram for a read operation of a memory topology with a double buffering configuration having RDIMMs, in accordance with various embodiments.

FIG. 11 shows an exemplary timing diagram 1100 for a read operation of a memory topology with a double buffering configuration having RDIMMs, in accordance with various embodiments. FIG. 11 depicts timing of signals for the exemplary read operation shown in FIG. 10.

The PB_BCOM diagram 1102 represents a BCOM signal for a portion of a plurality of data buffers (e.g., FIGS. 3-4). The PA_BCOM diagram 1104 represents a BCOM signal for another portion of a plurality of data buffers (e.g., FIGS. 3-4). The FPGA CA diagram 1106 represents a command/address signal. The FPGA CSN diagram 1108 represents a chip select signal (e.g., active low chip select signal). The P_RCD QxCA diagram 1110 represents a command/address signal driven by a primary RCD. The DIMM CSN diagram 1112 represents a memory module chip select signal (e.g., active low chip select signal). The DIMM CA diagram 1114 represents a memory module command/address signal. The RCD QxCA (DB BCOM) diagram 1116 represents a command/address signal driven by a RCD of a memory module. The DIMM DQ (DB DQ) diagram 1120 represents data signal driven by a memory module. The P_DB BCOM diagram 1122 represents a BCOM signal to one or more primary data buffers. The P_DB MDQ diagram 1124 represents a data signal at one or more primary data buffers. The FPGA DQ diagram 1126 represents a data signal at a memory controller.

The timing diagram 1100 includes exemplary signals for a single column access to a rank in secondary channel (e.g., SC-A 130A). The memory controller can send two read commands. A first read command is sent on a command/address bus (e.g., FPGA CA). A second read command is send on a first BCOM bus (e.g., PA_BCOM). A no operation (NOP) is sent on a second BCOM bus (e.g., PB_BCOM). A time delay of tPD1+tSTAOFF+tPD2 later, the CSN signal arrives at the RCD on the memory module (e.g., DIMM). The primary data buffers of one secondary channel (e.g., SC-A 130A) transfer the read data with an optimized latency (e.g., P_DB_RL). The DRAM of the memory module receives the CSN signal tSTAOFF later. The primary data buffers in another secondary channel (e.g., SC-B 130B) keep the data (DQ) driver disabled so that no data conflict occurs.

Figure 12:
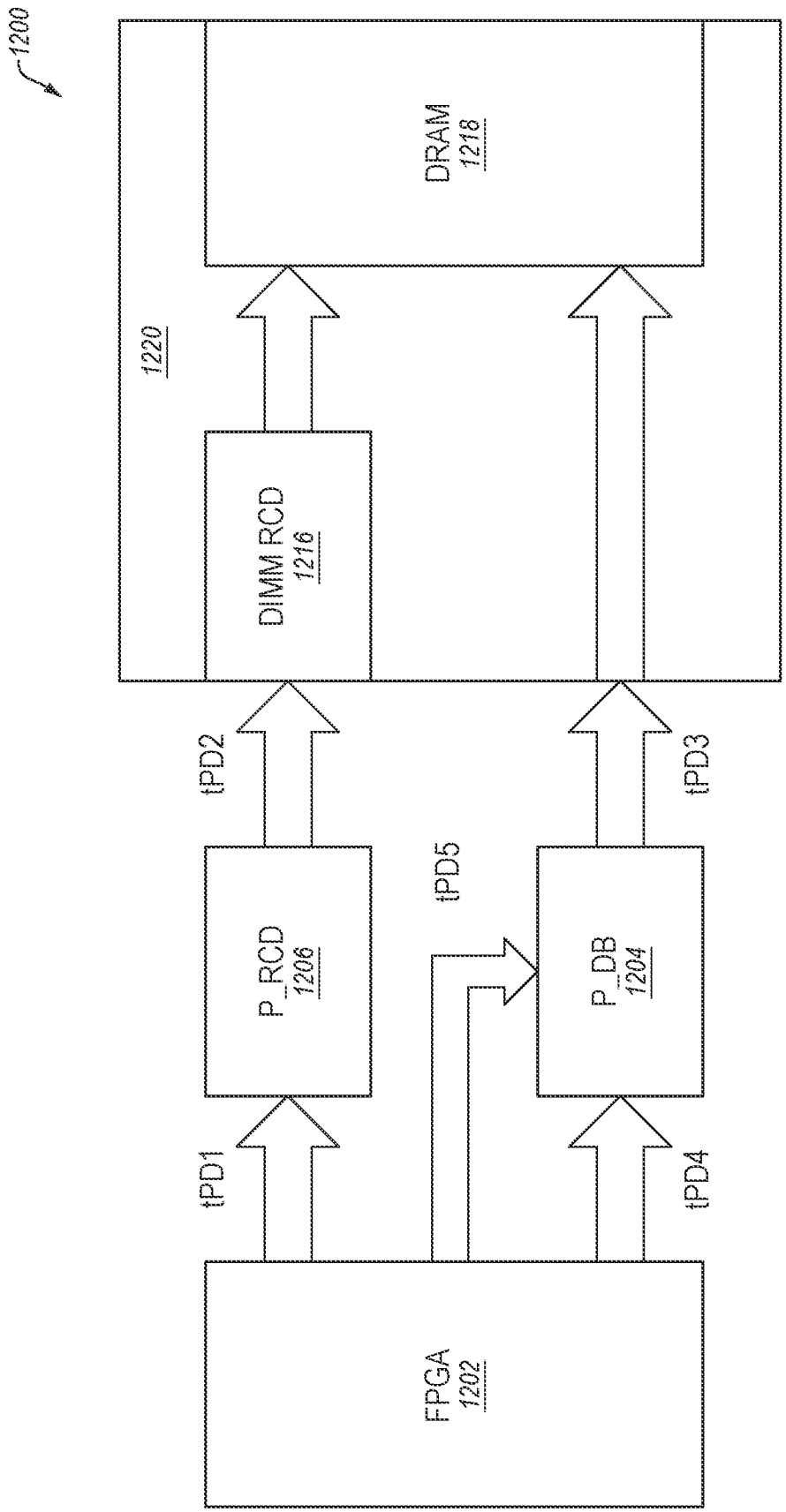
FIG. 12 shows exemplary communications for a write operation of a memory topology with a double buffering configuration having RDIMMs, in accordance with various embodiments.

FIG. 12 shows exemplary communications for a write operation of a memory topology with a double buffering configuration having RDIMMs, in accordance with various embodiments. FIG. 12 depicts exemplary communications within a system 1200 including a memory controller 1202, a primary RCD 1206, a memory module 1220, and primary data buffers 1204. The memory controller 1202 is coupled to the primary RCD 1206 and the memory module 1220 via a command/address bus. The memory controller 1202 is coupled to the primary data buffers 1204 and the memory module 1220 via a data bus. The memory controller 1202 is coupled to the primary data buffers 1204 via control buses (e.g., for transmission of data buffer control signals 360A-B). It is noted that the primary data buffers 1204 represent multiple buffers (e.g., as shown in FIG. 4). In some embodiments, the memory controller 1202 is an FPGA.

The memory controller 1202 sends a write command and an address to the primary RCD 1206 with a time delay of tPD1. The memory controller 1202 signals the primary data buffers 1204 with a time delay of tPD5. The primary data buffers 1204 receive data from the memory controller 1202 with a time delay of tPD4. The primary RCD 1206 sends the write command and the address to a DIMM RCD 1216 of the memory module 1220 with a time delay of tPD2. The DIMM RCD 1216 sends appropriate portions of the write command and the address to the DRAM 1218 of the memory module 1220.

The DRAM 1218 of the memory module 1220 receives data from the primary data buffers 1204 with a delay of tPD3. The timing delays of tPD1, tPD2, tPD3, tPD4, and tPD5 are configured to allow operation of communications with the double buffered memory topology.

Figure 13:
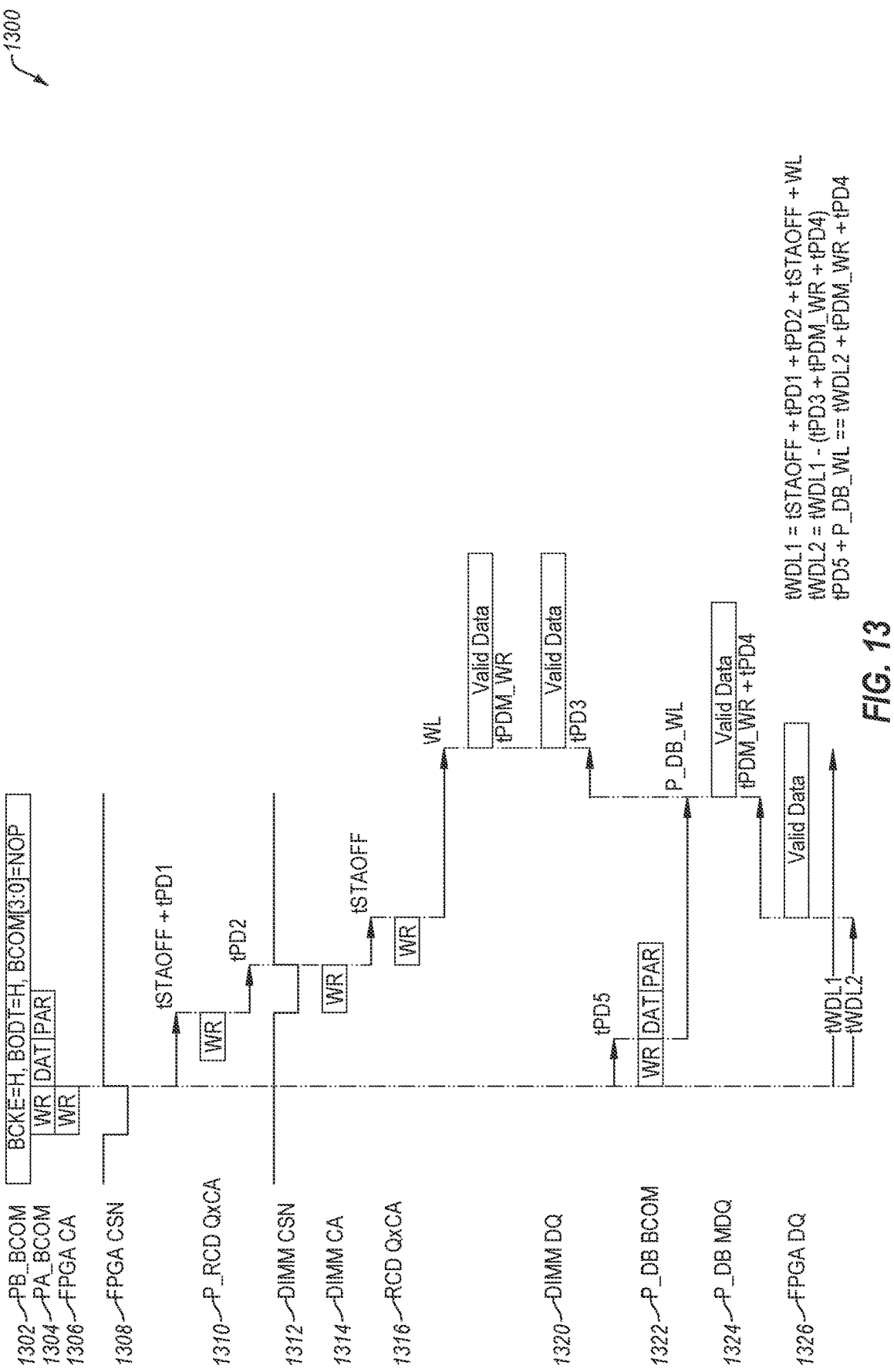
FIG. 13 shows an exemplary timing diagram for a write operation of a memory topology with a double buffering configuration having RDIMMs, in accordance with various embodiments.

FIG. 13 shows an exemplary timing diagram 1300 for a write operation of a memory topology with a double buffering configuration having RDIMMs, in accordance with various embodiments. FIG. 13 can represent the timing of signals for the exemplary write operation shown in FIG. 12.

The PB_BCOM diagram 1302 represents a BCOM signal for a portion of a plurality of data buffers (e.g., FIGS. 3-4). The PA_BCOM diagram 1304 represents a BCOM signal for another portion of the plurality of data buffers (e.g., FIGS. 3-4). The FPGA CA diagram 1306 represents a command/address signal. The FPGA CSN diagram 1308 represents a chip select signal (e.g., active low chip select signal). The P_RCD QxCA diagram 1310 represents a command/address signal driven by a primary RCD. The DIMM CSN diagram 1312 represents a memory module chip select signal (e.g., active low chip select signal). The DIMM CA diagram 1314 represents a memory module command/address signal. The RCD QxCA (DB BCOM) diagram 1316 represents a command/address signal driven by a RCD of a memory module. The DIMM DQ (DB DQ) diagram 1320 represents a data signal received by a memory module. The P_DB BCOM diagram 1322 represents a BCOM signal to one or more primary data buffers. The P_DB MDQ diagram 1324 represents a data signal at one or more primary data buffers. The FPGA DQ diagram 1326 represents a data signal at a memory controller.

The timing diagram 1300 includes exemplary signals for a single column access to a rank in secondary channel (e.g., SC-A 130A). The memory controller can send two write commands. A first write command is sent on a command/address bus (e.g., FPGA CA). A second write command is send on a first BCOM bus (e.g., PA_BCOM). A no operation (NOP) is sent on a second BCOM bus (e.g., PB_BCOM). A time delay of tPD1+tSTAOFF+tPD2 later, the CSN signal arrives the RCD of the memory module (e.g., DIMM). The primary data buffers of one secondary channel (e.g., SC-A 130A) transfer the write data with an optimized latency (e.g., P_DB_WL). The DRAM of the memory module receives the CSN signal tSTAOFF later. The primary data buffers in another secondary channel (e.g., SC-B 130B) keep the data (DQ) driver disabled so that no data conflict occurs.

With reference to the FIGS., the flowcharts illustrate example functions used by various embodiments for initialization and training processes, as described herein. Although specific function blocks ("blocks") are disclosed in the FIGS., such steps are exemplary. That is, embodiments are well suited to performing various other blocks or variations of the blocks recited in the FIGS. It is appreciated that the blocks in the FIGS. can be performed in an order different than presented, and that not all of the blocks in the FIGS. need be performed.

Figure 14:
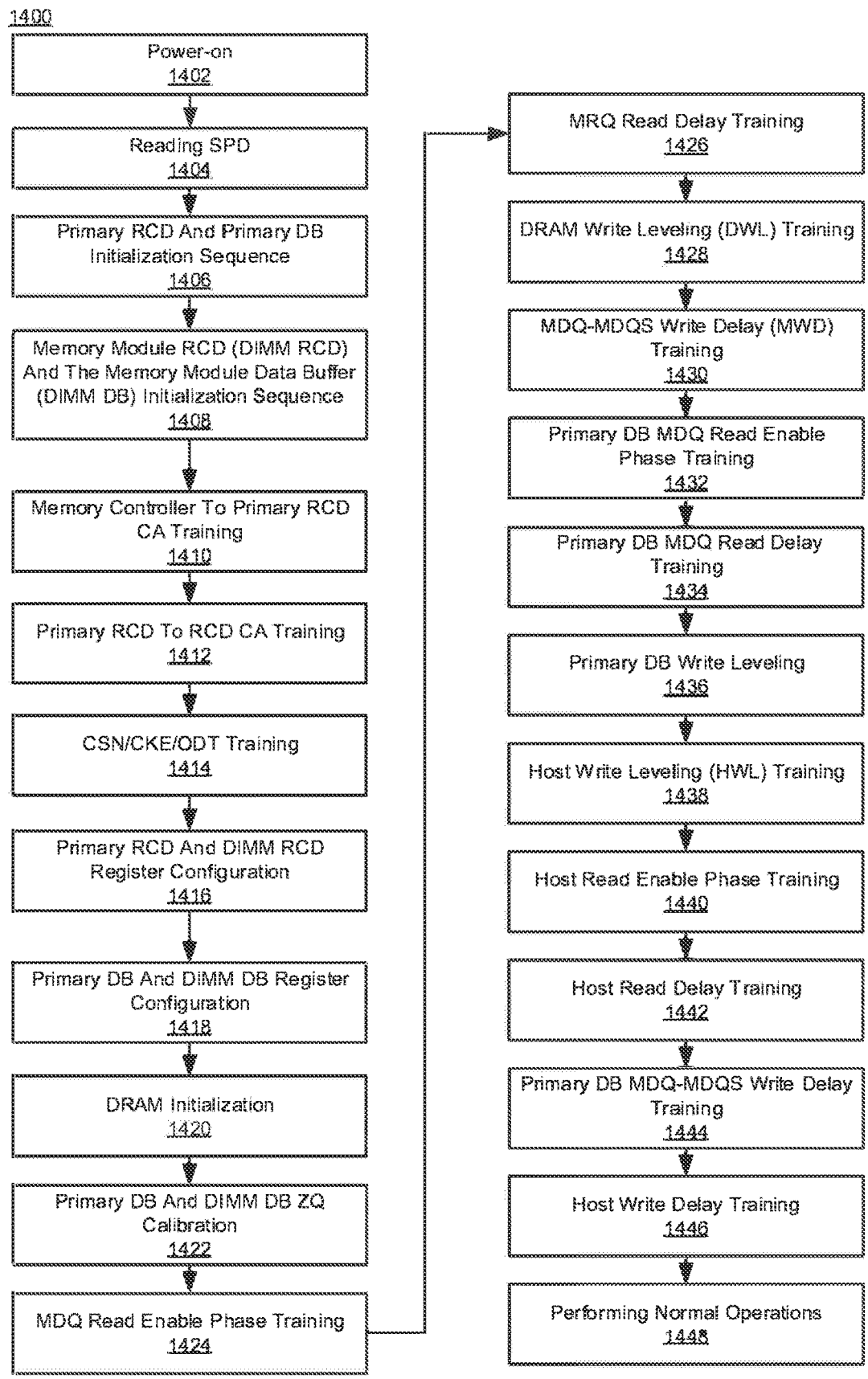
FIG. 14 shows a computer controlled training process for a memory topology with a double buffering configuration, in accordance with various embodiments.

FIG. 14 shows a computer controlled training process for a memory topology with a double buffering configuration, in accordance with various embodiments. FIG. 14 depicts a computer controlled process 1400 for training the signaling of a primary RCD, data buffers, and memory modules. In some embodiments, for the command/address bus and the chip select from the memory controller to the primary RCD, the clock to command/address and chip select signal skew should be guaranteed prior to training. In some embodiments, for the BCOM bus from the memory controller to the primary data buffers, the buffer clock to the BCOM bus should be guaranteed. In some embodiments, a signaling bus (e.g., I²C or SMbus) to each of the memory modules should be functional prior to the training of process 1400. The training process 1400 can include command/address bus training, training between primary data buffers and data buffers of one or more memory modules, read and write latency training for primary data buffers, and training of primary data buffer operation modes.

At block 1402, a computer system is powered on. The computer system may be restarted or powered on from an off state.

At block 1404, serial presence detect (SPD) information is read. The SPD information can be read from one or more memory modules within the computer system.

At block 1406, a primary RCD and primary data buffer (DB) initialization sequence is performed.

At block 1408, the memory module RCD (DIMM RCD) and the memory module data buffer (DIMM DB) initialization sequence is performed.

At block 1410, memory controller to primary RCD command/address (CA) training is performed. The memory controller enables a Clock-to-CA training mode in the primary RCD through a serial communication bus (e.g., I²C or SMbus). In the Clock-to-CA training mode, the primary RCD output registers (ORs) are enabled with Dn inputs every other cycle together and with loop back of the result to an ALERT_n output pin. The memory controller sends the training patterns to the primary RCD. Using the results available on ALERT_n, the memory controller programs the memory controller output delays on CA in order to center the CA eye opening relative to the clock edge.

At block 1412, the primary RCD to an RCD of a memory module CA training is performed. The primary RCD to RCD training can include the memory controller (e.g., FPGA) enabling a Clock-to-CA training mode in a DIMM RCD through a signaling bus (e.g., I²C or SMbus). In the Clock-to-CA training mode, each of the DIMM RCD ORs is enabled with Dn inputs every other cycle together and with loop back of the result to an ALERT_n output pin. The memory controller sends the training patterns to the primary RCD. The primary RCD drives the same patterns on QxCA outputs that will arrive on Dn inputs of DIMM RCD. Using the results available on ALERT_n, the memory controller programs the primary RCD output delays on QxCA and Yx_t/c in order to center the QxCA eye opening relative to Yx_t/c clock edge by means of RCW commands to the primary RCD.

At block 1414, CSN/CKE/ODT training is performed. The CSN/CKE/ODT training can be performed with an I²C bus (e.g., in a similar procedure to the memory controller to the primary RCD CA training).

At block 1416, primary RCD and DIMM RCD register configuration is performed.

At block 1418, primary DB and DIMM DB register configuration is performed.

At block 1420, DRAM initialization is performed.

At block 1422, primary DB and DIMM DB ZQ calibration is performed.

At block 1424, MDQ read enable phase training is performed. Prior to the training, the memory controller enables the transparent mode in the primary DB.

At block 1426, MDQ read delay training is performed.

At block 1428, DRAM write leveling (DWL) training is performed.

At block 1430, MDQ-MDQS write delay training is performed. After the training, the memory controller disables the transparent mode in the primary DB.

At block 1432, primary DB MDQ read enable phase training is performed. The memory controller enables MDQ Receive Enable Phase training mode in the primary DB. In MDQ Receive Enable Phase training mode, the primary DBs use sampling circuits to capture the MDQS_t/c signals received from the DIMM DBs. The primary DBs drive the output of sampling circuits on DQ pin corresponding to each nibble. There can be a sampling circuit per nibble. The memory controller enables MPR Override mode in the DIMM DBs and program the multiple purpose register (MPR). The memory controller sends a sequence of Read commands to the DIMM DBs through the primary RCDs in order to generate a continuous train of pulse in MDQS_t/c inputs of the primary DBs. The memory controller also sends this same sequence of Read commands to the primary DBs. Using the output of the sampling circuits available on the primary DB DQ pins, the memory controller determines if it needs to increase or decrease the receive enable phase control settings in the primary DBs by means of BCW Write commands. The memory controller also determines if it needs to override the stored snooped MRS setting for CAS Read latency in the primary DBs. In some embodiments, package rank timing alignment (PRTA) mode is used in the DIMM DBs due to a MPR override mode using only rank-0 timing. PRTA mode is also used in the primary DBs.

At block 1434, primary DB MDQ read delay training is performed. The primary DB read delay training is performed between the primary DBs and DIMM DBs. The memory controller enables MDQ Read Delay training mode in the primary DBs and programs the primary DB multiple purpose registers (MPRs) with the expected data patterns by means of BCW write commands. In MDQ Read Delay training mode, the primary DBs use a data comparator to determine if the read data received from the DIMM DBs matches the expected data. The primary DBs drive the output of the comparator on DQ pins corresponding to each data buffer. There can be a data buffer comparator per data buffer. The memory controller enables MPR Override mode in the DIMM DBs and programs MPRs with the training patterns by means of BCW write commands. The memory controller sends a sequence of Read commands to the primary DBs and the primary RCDs. The primary RCD drives them to the DIMMs and causes the DIMM DBs to send the contents of MPRs back the primary DBs. Using the output of the comparators available on the primary DB DQ pins, the memory controller determines if it needs to increase or decrease the primary DB MDQS delay settings by means of BCW write commands. In some embodiments, package rank timing alignment (PRTA) mode is used in the DIMM DBs due to a MPR override mode using only rank-0 timing. PRTA mode is also used in the primary DBs.

At block 1436, primary DB write leveling is performed. The primary DB write leveling training is performed between the primary DBs and the DIMM DBs. The memory controller enables Host Interface Write Leveling mode in the DIMM DBs by means of BCW write commands. In Host Interface Write Leveling mode, the DIMM DBs will signal the strobe to clock alignment on DQ pins. The memory controller enables DRAM Interface Write Leveling mode in the primary DBs by means of BCW write commands. In DRAM Interface Write Leveling mode, the primary DBs generate a sequence of pulses on its MDQS_t/c and drives the sampled MDQ onto the DBs. Using the data buffer feedback available on the primary DB DQ pins, the memory controller will be able to determine if it needs to increase or decrease the DRAM Interface Write Leveling control setting in the primary DBs by means of BCW write commands. In some embodiments, package rank timing alignment (PRTA) mode is used in the DIMM DBs for writes since PRTA mode is being used for reads. PRTA mode is also used in the primary DBs.

At block 1438, host write leveling (HWL) training is performed. In some embodiments, the primary DBs are in PRTA mode.

At block 1440, host read enable phase training is performed. In some embodiments, the primary DBs are in PRTA mode.

At block 1442, host read delay training is performed. In some embodiments, the primary DBs are in PRTA mode.

At block 1444, primary DB MDQ-MDQS write delay training is performed. The primary DB MDQ-MDQS write delay training is performed between the primary DBs and the DIMM DBs. The memory controller enables Host Interface Write training mode in the DIMM DBs and programs DIMM DB multiple purpose registers (MPRs) with the expected data patterns by means of BCW write commands. In Host Interface Write training mode, the DIMM DBs use a comparator to determine if the write data matches the expected data and provides the result in the training status words. In some embodiments, there is a data comparator per data buffer. It can be assumed that the path from DIMM to the memory controller through the primary DBs has been trained at this time so that the memory controller can read out the training status words in DIMM DBs by means of BCW Read commands. The memory controller enables MDQ-MDQS Write Delay training mode in the primary DBs and programs the primary DB MPRs with the training patterns by means of BCW write commands. The memory controller sends a sequence of Write commands to the primary DBs in order to send the contents of the primary DB MPRs to DIMM DBs. At the same time, the memory controller can send a sequence of Write commands to DIMM DBs through the primary RCDs in order to receive the training patterns from the primary DBs. Using the result available in DIMM DBs' training status words and error status words, the memory controller programs MDQ-MDQS phase settings in the primary DBs and also determines if it is needs to override snooped an MRS setting for CAS write latency in the primary DBs. In some embodiments, the DIMM DBs and the primary DBs are in PRTA mode.

At block 1446, host write delay training is performed. In some embodiments, the primary DBs are in PRTA mode.

In some embodiments, the memory controller enables PDA mode in the primary DBs before the memory controller sends BCW write commands to the DIMM DBs in PBA mode. The memory controller drives "0" onto DIMM DB's MDQ and strobe patterns onto DIMM DB's MDQS through primary DBs for a BCW write. The memory controller enables PDA mode in the primary DBs before the memory controller sends MRS to DRAM in PDA mode. The memory controller drives "0" onto a DIMM DB's MDQ and strobe patterns onto DIMM DB's MDQS through the primary DBs for a MRS command.

At block 1448, normal operations are performed. The normal operations mode can include read operations and write operations, as described herein. In some embodiments, the DIMM DBs and the primary DBs are in PRTA mode during normal operation.

In some embodiments, the memory controller drives the BCK for each of 18 data buffers. Training of the BCOM bus is not needed because the BCK-to-BCOM skew is guaranteed by physical design and BCOM topology configuration to drive BCK along with BCOM[3:0] with the memory controller.

Figure 15:
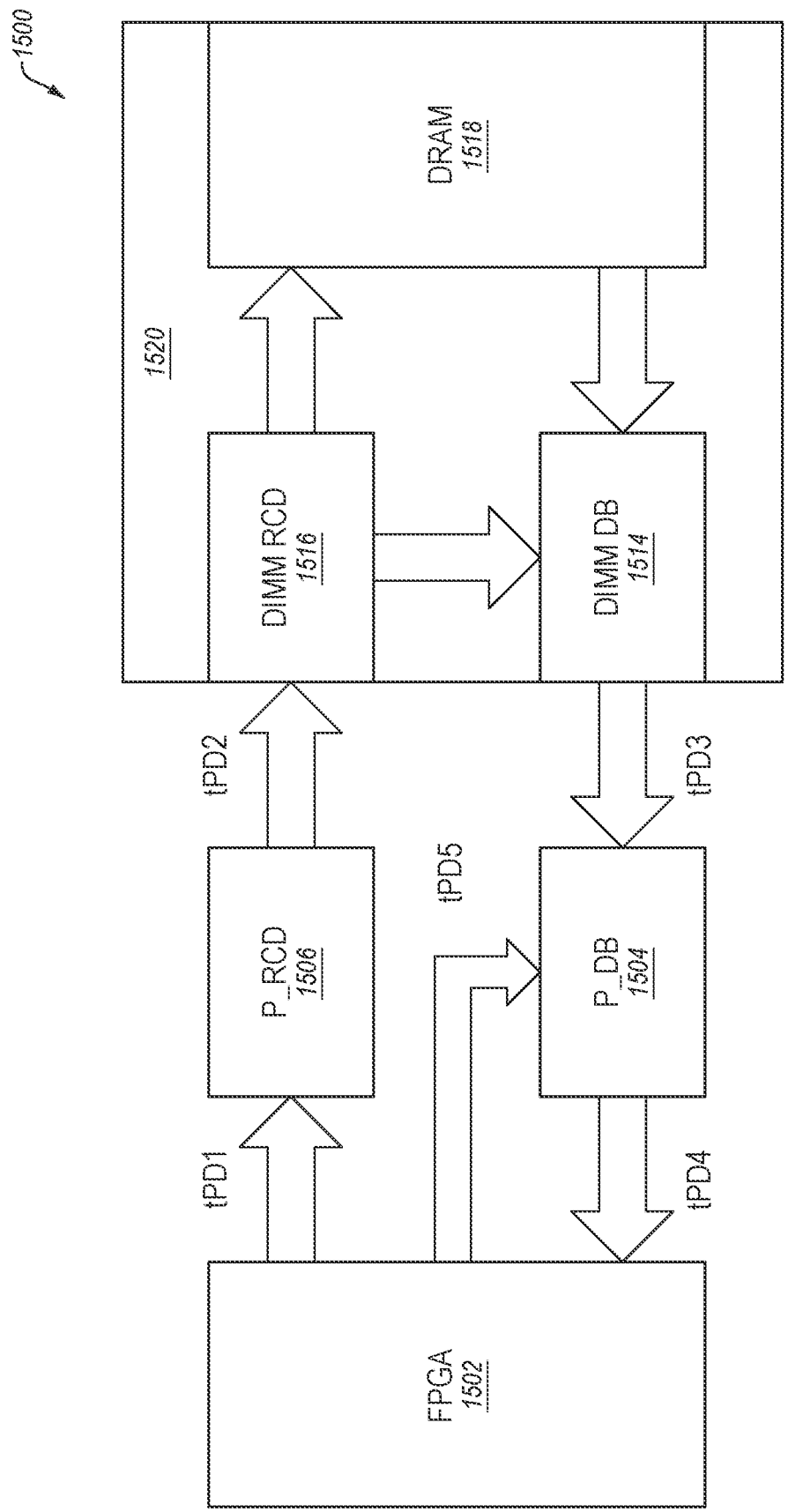
FIG. 15 shows exemplary communications for a read training operation of a memory topology with a double buffering configuration having LRDIMMs, in accordance with various embodiments.

FIG. 15 shows exemplary communications for a read operation of a memory topology with a double buffering configuration having LRDIMMs, in accordance with various embodiments. FIG. 15 depicts exemplary communications within a system 1500 including a memory controller 1502, a primary RCD 1506, a memory module 1520, and primary data buffers 1504. The memory controller 1502 is coupled to the primary RCD 1506 and the memory module 1520 via a command/address bus. The memory controller 1502 is coupled to the primary data buffers 1504 and the memory module 1520 via a data bus. The memory controller 1502 is coupled to the primary data buffers 1504 via control buses (e.g., for transmission of data buffer control signals 360A-B). It is noted that the primary data buffers 1504 and the DIMM data buffers (DB) 1514 represent multiple buffers (e.g., as shown in FIG. 4). In some embodiments, the memory controller 1502 is an FPGA.

The memory controller 1502 sends a read command and an address to the primary RCD 1506 with a time delay of tPD1. The memory controller 1502 signals the primary data buffers 1504 with a time delay of tPD5. The primary RCD 1506 sends the read command and the address to a DIMM RCD 1516 of the memory module 1520 with a time delay of tPD2. The DIMM RCD 1516 send appropriate portions of the read command and the address to the DRAM 1518 and DIMM data buffer (DB) 1514 of the memory module 1520. The DIMM DB 1514 receives data in response to the read command from the DRAM 1518. The DIMM DB 1514 sends the data to the primary data buffers 1504 with a delay of tPD3. The primary data buffers 1504 sends the data to the memory controller 1502 with a time delay of tPD4. The timing delays of tPD1, tPD2, tPD3, tPD4, and tPD5 are configured to allow initialization and/or training of communications with the double buffered memory topology.

Figure 16:
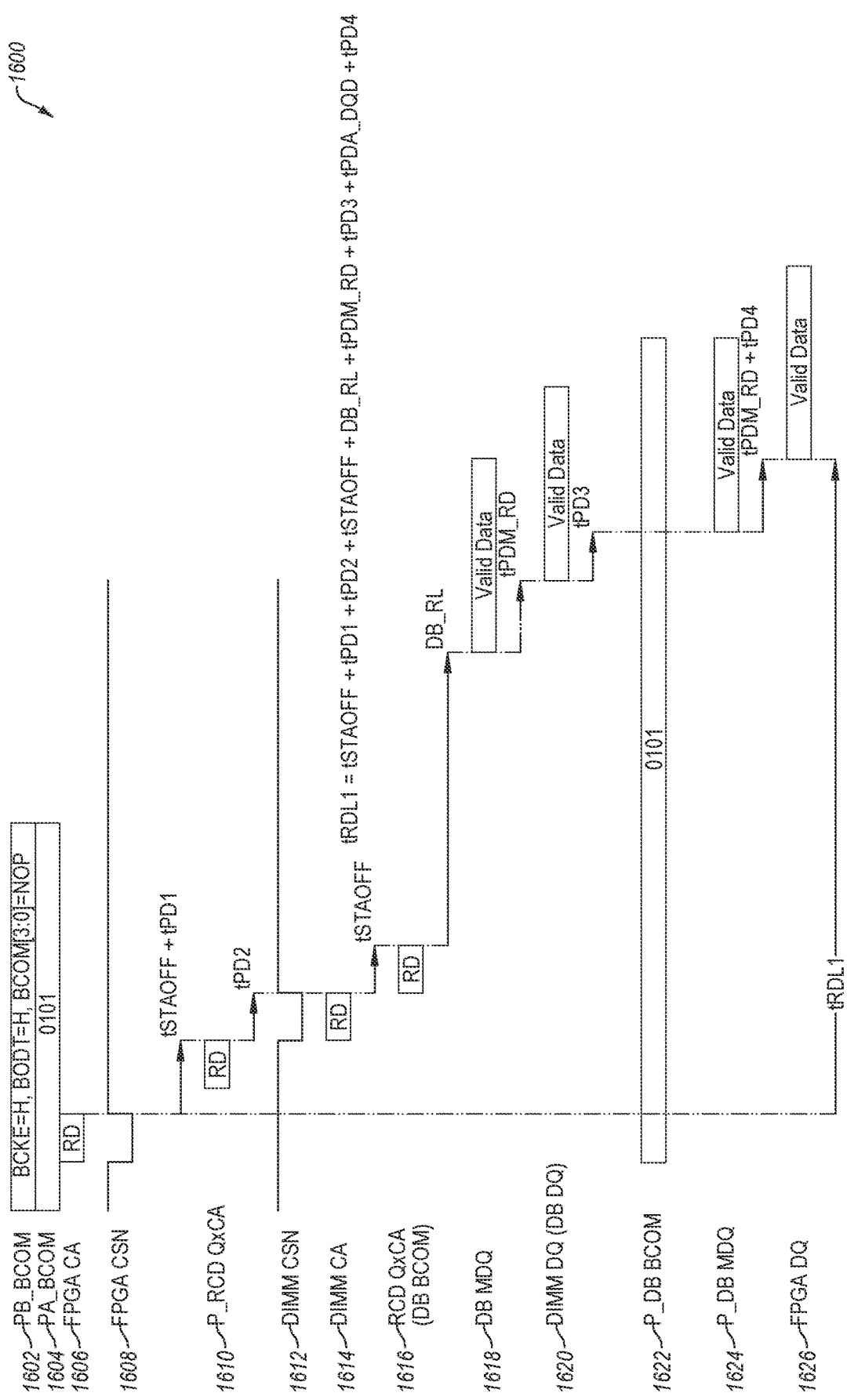
FIG. 16 shows an exemplary timing diagram for a read operation of a memory topology with a double buffering configuration having LRDIMMs, in accordance with various embodiments.

FIG. 16 shows an exemplary timing diagram 1600 for a read operation of a memory topology with a double buffering configuration having LRDIMMs, in accordance with various embodiments. FIG. 16 depicts timing of signals for the exemplary read operation shown in FIG. 15.

The PB_BCOM diagram 1602 represents a BCOM signal for a portion of a plurality of data buffers (e.g., FIGS. 3-4). The PA_BCOM diagram 1604 represents a BCOM signal for another portion of the plurality of data buffers (e.g., FIGS. 3-4). The FPGA CA diagram 1606 represents a command/address signal. The FPGA CSN diagram 1608 represents a chip select signal (e.g., active low chip select signal). The P_RCD QxCA diagram 1610 represents a command/address signal driven by a primary RCD. The DIMM CSN diagram 1612 represents a memory module chip select signal (e.g., active low chip select signal). The DIMM CA diagram 1614 represents a memory module command/address signal. The RCD QxCA (DB BCOM) diagram 1616 represent a command/address signal driven by a RCD of a memory module. The DB MDQ diagram 1618 represents a data signal of a DRAM of a memory module. The DIMM DQ (DB DQ) diagram 1620 represents a data signal driven by a data buffer of a memory module. The P_DB BCOM diagram 1622 represents a BCOM signal to one or more primary data buffers. The P_DB MDQ diagram 1624 represents a data signal at one or more primary data buffers. The FPGA DQ diagram 1626 represents a data signal at a memory controller.

The timing diagram 1600 includes exemplary signals for a single column access to a rank in secondary channel (e.g., SC-A 130A). In some embodiments, the memory controller sends a read command on a command/address bus. A command of "0101" is sent on a first BCOM bus (e.g., PA_BCOM). A low signal is sent on a second BCOM bus clock enable (e.g., PB_BCKE=L) and a high signal is sent for an ODT signal for the second BCOM bus (e.g., PB_BODT=H). The primary data buffers in a first secondary channel (SC-A 130A) enable a read bypass mode. The primary data buffers in a second secondary channel (SC-B 130A) are PDN.

Figure 17:
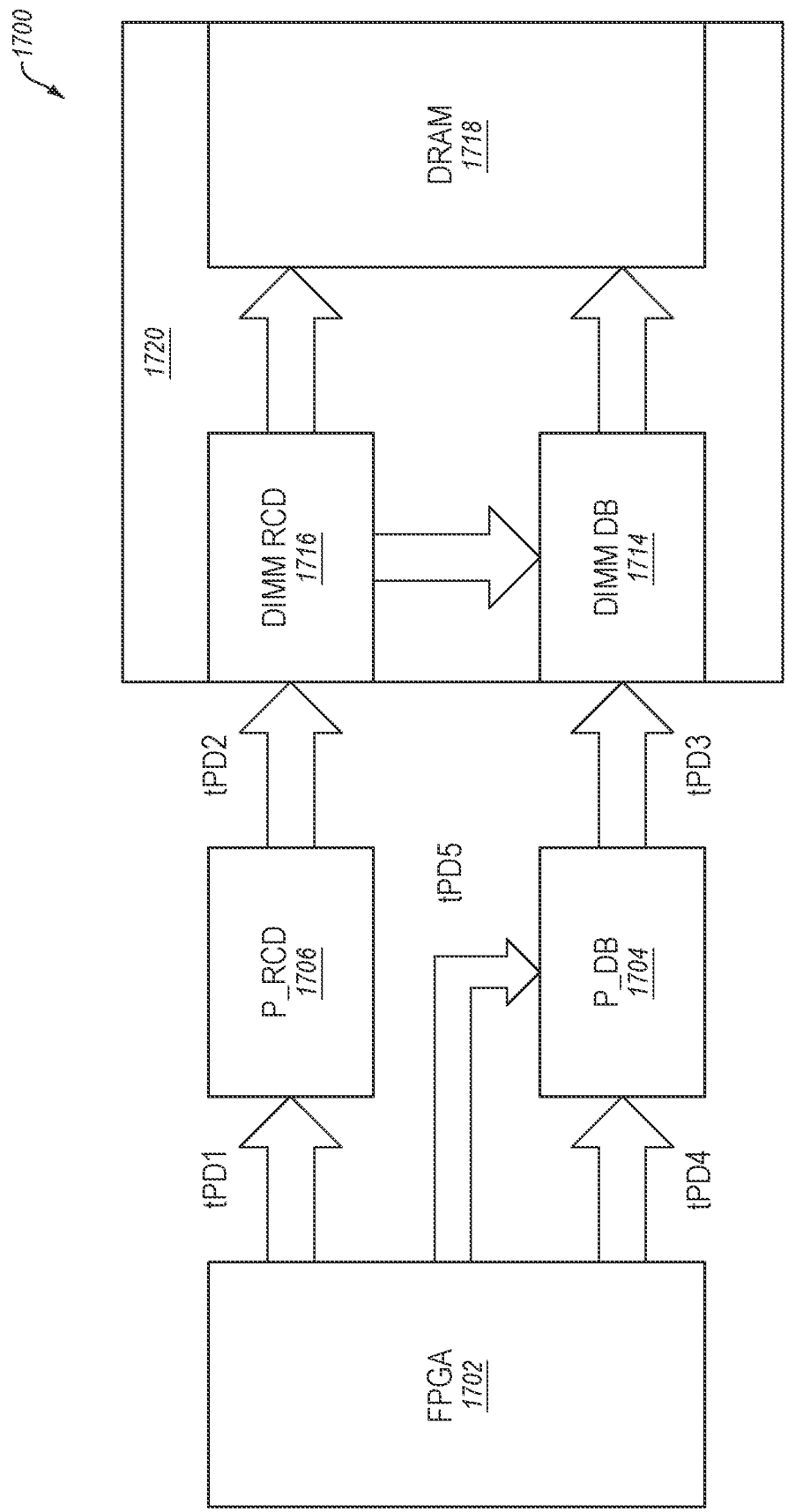
FIG. 17 shows exemplary communications for a write operation of a memory topology with a double buffering configuration having LRDIMMs, in accordance with various embodiments.

FIG. 17 shows exemplary communications for a write operation of a memory topology with a double buffering configuration having LRDIMMs, in accordance with various embodiments. FIG. 17 depicts exemplary communications within a system 1700 including a memory controller 1702, a primary RCD 1706, a memory module 1720, and primary data buffers 1704 during the a write operation. The memory controller 1702 is coupled to the primary RCD 1706 and the memory module 1720 via a command/address bus. The memory controller 1702 is coupled to the primary data buffers 1704 and the memory module 1720 via a data bus. The memory controller 1702 is coupled to the primary data buffers 1704 via control buses (e.g., for transmission of data buffer control signals 360A-B). It is noted that the primary data buffers 1704 and the DIMM data buffers (DB) 1714 represent multiple buffers (e.g., as shown in FIG. 4). In some embodiments, the memory controller 1702 is an FPGA.

The memory controller 1702 sends a write command and an address to the primary RCD 1706 with a time delay of tPD1. The memory controller 1702 signals the primary data buffers 1704 with a time delay of tPD5. The primary data buffers 1704 receive data from the memory controller 1702 with a time delay of tPD4. The primary RCD 1706 sends the write command and the address to a DIMM RCD 1716 of the memory module 1720 with a time delay of tPD2. The DIMM RCD 1716 sends appropriate portions of the write command and the address to the DRAM 1718 and DIMM DB 1714 of the memory module 1720. The DIMM DB 1714 receives data from the primary data buffers 1704 with a delay of tPD3. The DIMM DB 1714 sends the data to the DRAM 1718 of the memory module 1720. The timing delays of tPD1, tPD2, tPD3, tPD4, and tPD5 are configured to allow operation of communications with the double buffered memory topology.

Figure 18:
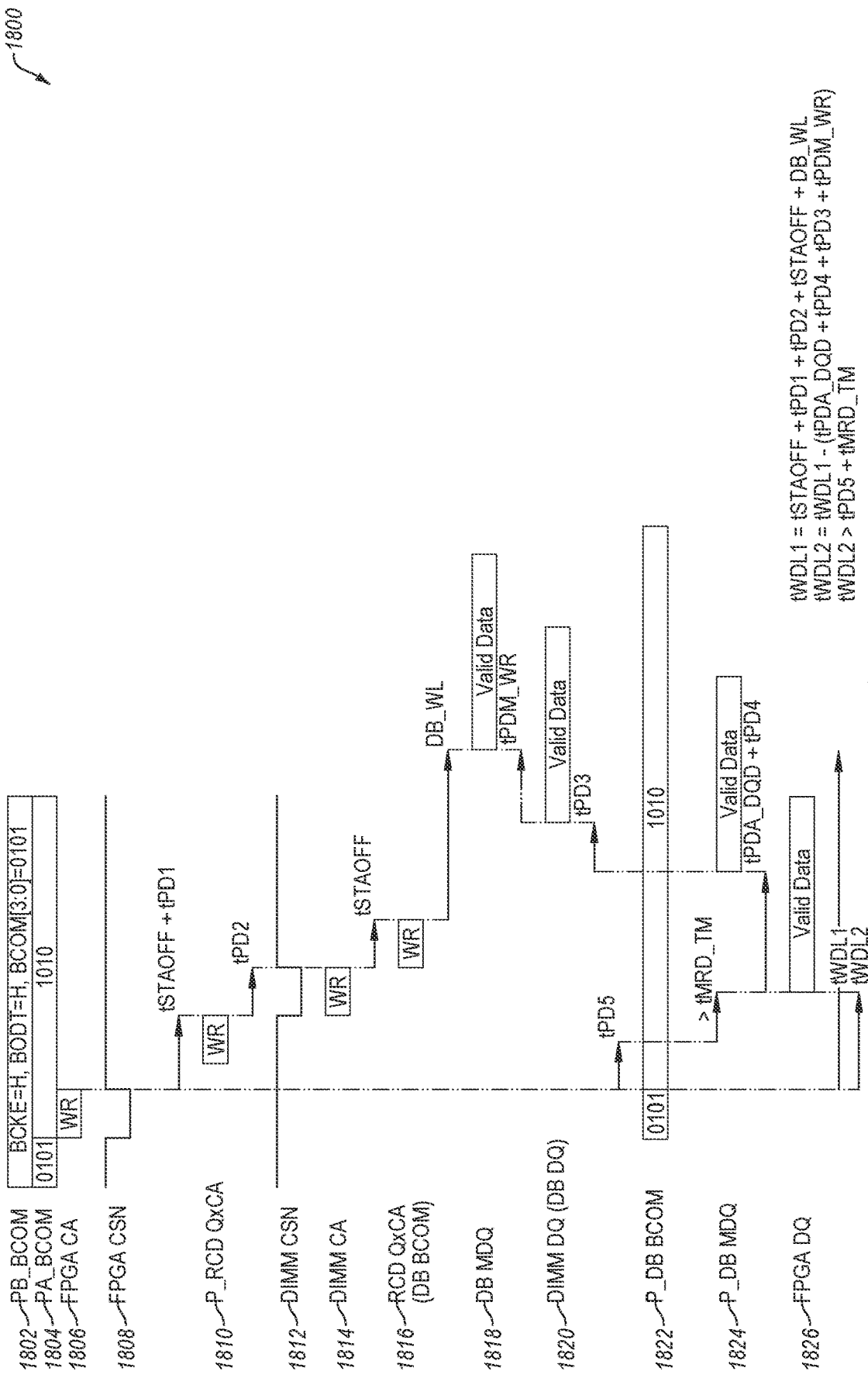
FIG. 18 shows an exemplary timing diagram for a write operation of a memory topology with a double buffering configuration having LRDIMMs, in accordance with various embodiments.

FIG. 18 shows an exemplary timing diagram for a write operation of a memory topology with a double buffering configuration having LRDIMMs, in accordance with various embodiments. FIG. 18 depicts timing of signals for the exemplary write operations shown in FIG. 17.

The PB_BCOM diagram 1802 represents a BCOM signal for a portion of a plurality of data buffers (e.g., FIGS. 3-4). The PA_BCOM diagram 1804 represents a BCOM signal for another portion of the plurality of data buffers (e.g., FIGS. 3-4). The FPGA CA diagram 1806 represents a command/address signal. The FPGA CSN diagram 1808 represents a chip select signal (e.g., active low chip select signal). The P_RCD QxCA diagram 1810 represents a command/address signal driven by a primary RCD. The DIMM CSN diagram 1812 represents a memory module chip select signal (e.g., active low chip select signal). The DIMM CA diagram 1814 represents a memory module command/address signal. The RCD QxCA (DB BCOM) diagram 1816 represents a command/address signal driven by a RCD of a memory module. The DB MDQ diagram 1818 represents a data signal of a DRAM of a memory module. The DIMM DQ (DB DQ) diagram 1820 represents data signal received by a data buffer of a memory module. The P_DB BCOM diagram 1822 represents a BCOM signal to one or more primary data buffers. The P_DB MDQ diagram 1824 represents a data signal at one or more primary data buffers. The FPGA DQ diagram 1826 represents a data signal at a memory controller.

The timing diagram 1800 includes exemplary signals for a single column access to a rank in secondary channel (e.g., SC-A 130A). The memory controller sends a write command on a command/address bus (e.g., FPGA CA). A command of "0101" is sent on a first BCOM bus (e.g., PA_BCOM[3:0]). A low signal is sent on a second BCOM bus clock enable (e.g., PB_BCKE=L) and a high signal is sent for an ODT signal for the second BCOM bus (e.g., PB_BODT=H). The primary data buffers in a first secondary channel (SC-A 130A) enable a write bypass mode. The primary data buffers in a second secondary channel (SC-B 130B) are PDN.

Figure 19:
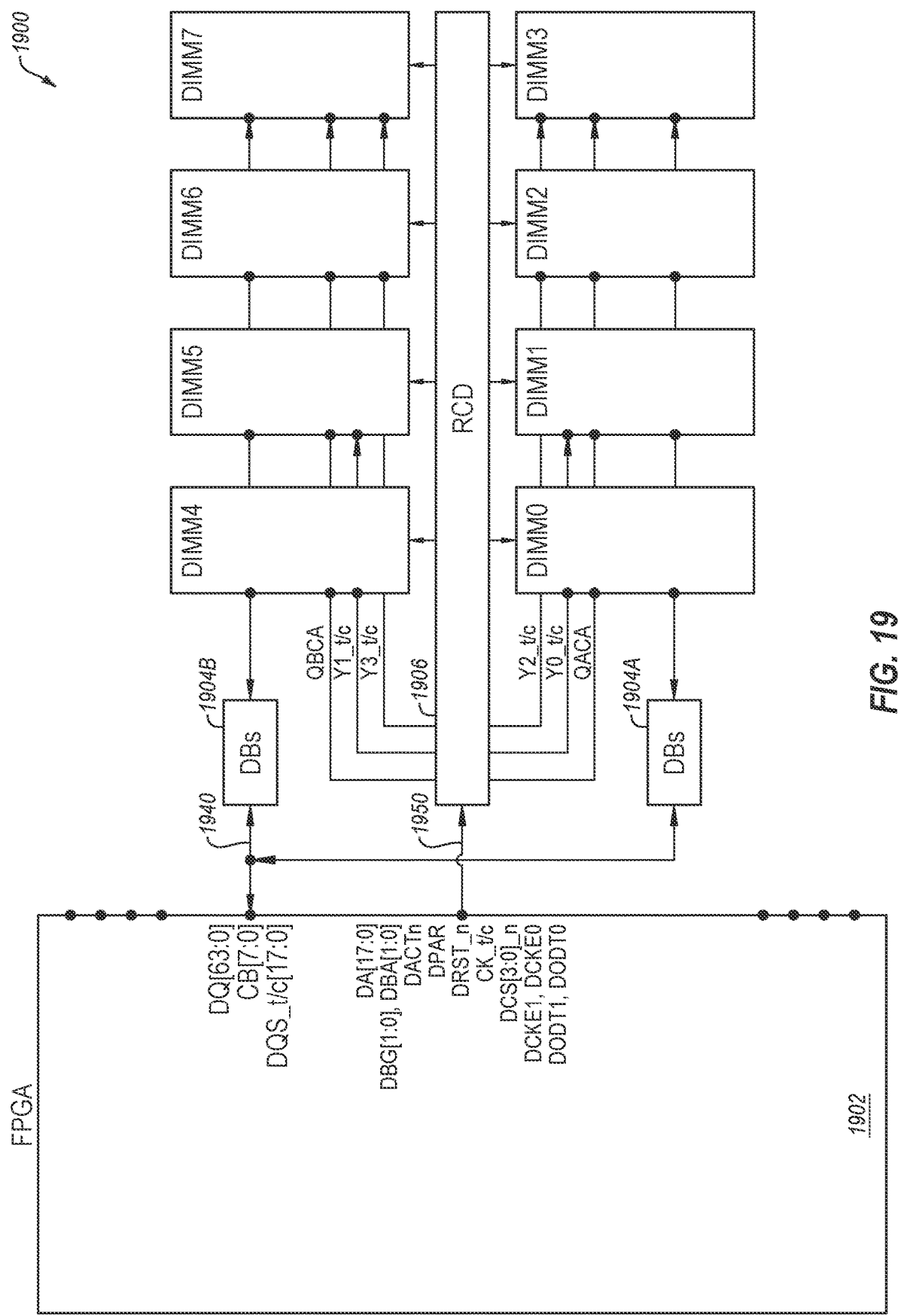
FIG. 19 shows exemplary signals associated with a double buffered memory topology comprising a device configured to perform a function of a memory controller, in accordance with various embodiments.

FIG. 19 shows exemplary signals associated with a double buffered memory topology comprising a device configured to perform a function of a memory controller, in accordance with various embodiments. FIG. 19 depicts exemplary data, command/address, and control couplings of a memory topology 1900 with a double buffering configuration (e.g., substantially similar to the memory topology 200). The memory topology 1900 includes a memory controller 1902, a data (DQ) bus 1940, a command/address bus 1950, sets of data buffers 1904A-B, a primary RCD 1906, and DIMMs 0-7.

In some embodiments, the sets of data buffers 1904A-B are located on a motherboard and are between the memory controller 1902 and an associated portion of DIMMs 0-7. For example, the set of data buffers 1904A drives the DIMMs 4-7 and the set of data buffers 1904B drives the DIMMs 0-3. In some embodiments, the sets of data buffers 1904A-B include electrical drivers to drive signals from the sets of data buffers 1904A-B through connection interfaces to the memory controller 1902 and to the memory modules (e.g., DIMMs 0-7). The electrical drivers of the sets of data buffers 1904A-B can be configured for driving signals based on the sets of data buffers 1904A-B being on a circuit board (e.g., a motherboard).

In some embodiments, the primary RCD 1906 is located on a motherboard and is between the memory controller 1902 and associated portions of DIMMs 0-7. For example, the primary RCD 1906 has address bus outputs that drive four memory modules each and the primary RCD 1906 has a plurality of clock outputs that drive two memory modules each. The primary RCD 1906 comprises functionality for signaling memory modules thereby functioning as a memory controller for the memory modules. For example, the primary RCD 1906 can send clock enable (CKE) signals, on-die termination (ODT) signals, chip select (CSN) signals (e.g., active low chip select signals), chip ID (C2) signals, to DIMMs 0-7 instead of the memory controller 1902. In some embodiments, the CKE, ODT, CSN, and C2, are sent via a point to point (P2P) connection. The determination and sending of the rank control signals (e.g., CSN) by the primary RCD 1906 can be used to enable logic control, timing control between different ranks, and calibration between the ranks. The primary RCD 1906 can thus determine and send rank control signals (e.g., CSN) to the memory modules in place of the memory controller 1902.

The primary RCD 1906 can include functionality to allow the use of a plurality memory modules beyond the memory capacity supported by the memory controller 1902. For example, where the memory controller 1902 supports two memory modules, the primary RCD 1906 can enable support of eight memory modules (e.g., the DIMMs 0-7). As another example, the memory controller 1902 may operate with indirect addressing and the primary RCD 1906 supports windowing of memory to support memory capacity beyond the capabilities of the memory controller 1902. The primary RCD 1906 can thus expand memory system capabilities beyond the capabilities of the memory controller 1902. The primary RCD 1906 can further support different memory address mappings depending on the memory module configuration. For example, the primary RCD 1906 can support a change in mapping from two 64 GB memory modules to a mapping for eight 16 GB memory modules.

In some embodiments, the primary RCD 1906 can further support the determination and signaling of BCOM signals to the sets of data buffers. For example, the primary RCD 1906 can determine and send BCOM signals to the sets of data buffers 1904A-B instead of the memory controller 1902 determining and sending the BCOM signals to the sets of data 1904A-B. The primary RCD 1906 can thus perform control, timing, logic, and training in place of the memory controller 1902.

The primary RCD 1906 is further configured to send timing signals to the sets of data buffers 1904A-B (e.g., via the BCOM bus and in place of the memory controller). The primary RCD 1906 can include logic configured to signal the sets of data buffers 1904A-B to operate such that signals to or from the DIMMs 0-7 are received or sent in accordance with operating parameters of the DIMMs 0-7. For example, the primary RCD 1906 can include logic for configuring a programmable range delay of the sets of data buffers 1904A-B such that signals including data, address, and/or parity signals are received at one or more of DIMMs 0-7 within the same clock cycle. As another example, the primary RCD 1906 can configure the sets of data buffers 1904A-B to have a delay of ten clock cycles instead of 2-3 clock cycles in order to receive data according to the configuration of the double buffered topology.

The primary RCD 1906 can further be configured to generate the address parity such that the address parity and address signal are received at a memory module (e.g., one or more of DIMMs 0-7) within the same clock cycle. The primary RCD 1906 can further be configured to send the data parity such that the data parity and data signal are received at a memory module (e.g., one or more of DIMMs 0-7) within the same clock cycle.

In some embodiments, the primary RCD 1906 is configured of signal a first set of buffers associated with a memory access to have a particular delay while signaling a second set of the buffers associated with an idle set of memory modules to be in a tristate mode. For example, for a memory access to DIMM0, the primary RCD 1906 signals the set of data buffers 1904A to have a particular signaling configuration (e.g., including a delay) and signals the set of data buffers 1904B to be in a tristate mode.

The memory controller 1902 is configured to send data (DQ) signals, check bit (CB) signals, data strobe (DQS_t/c) signals. The memory controller 1902 is further configured to send address (DA), bank group (DBG), bank address (DBA), activation (DACTn), command and address parity (DPAR), DRAM reset (DRST_n), clock (CK_t/c), chip select (DCS_n), clock enable 1 (DCKE1), clock enable 0 (DCKE0), on-die termination 1 (DODT1), and on-die termination 0 (DODT0) signals. The memory controller 1902 can send the DPAR to the RCD 1906.

Figure 20:
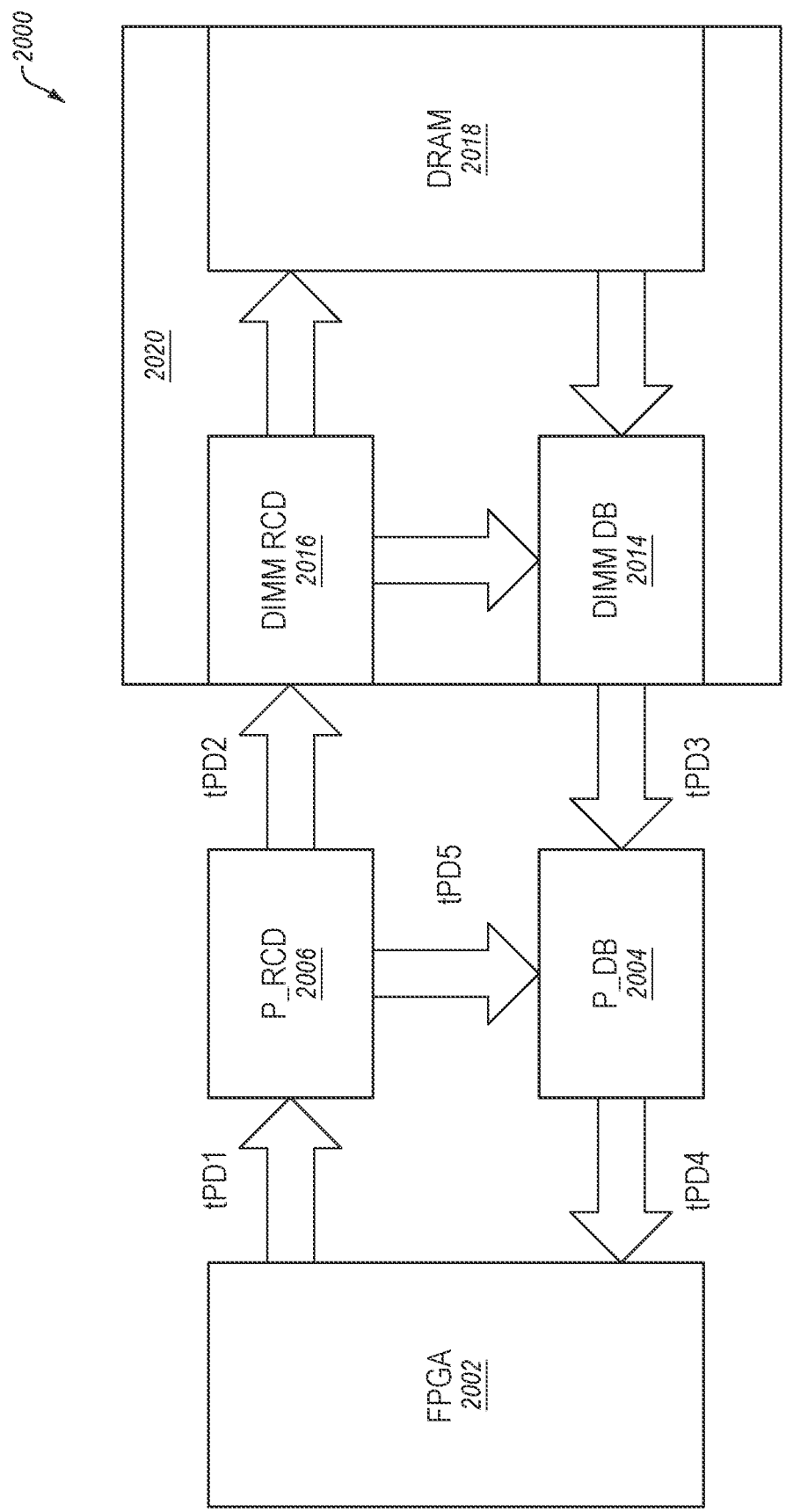
FIG. 20 shows exemplary communications for a read operation of a memory topology with a double buffering configuration having load reduced dual in-line memory modules (LRDIMMs), where the memory topology comprises a device configured to perform a function of a memory controller, in accordance with various embodiments.

FIG. 20 shows exemplary communications for a read operation of a memory topology with a double buffering configuration having load reduced dual in-line memory modules (LRDIMMs), where the memory topology comprises a device configured to perform a function of a memory controller, in accordance with various embodiments. FIG. 20 depicts exemplary communications within a system 2000 of a memory controller 2002, a primary RCD 2006, a memory module 2020, and primary data buffers 2004 with timing configured for performing a read operation. The primary RCD 2006 is configured to perform one or more functions of a memory controller (e.g., as described with respect to FIG. 19). The memory controller 2002 is coupled to the primary RCD 2006 and the memory module 2020 via a command/address bus. The memory controller 2002 is coupled to the primary data buffers 2004 and the memory module 2020 via a data bus. The memory controller 2002 is coupled to the primary data buffers 2004 via control buses (e.g., for transmission of data buffer control signals 360A-B). It is noted that the primary data buffers 2004 and the DIMM data buffers (DB) 2014 represent multiple buffers (e.g., as shown in FIG. 4). In some embodiments, the memory controller 2002 is an FPGA.

The memory controller 2002 sends a read command and an address to the primary RCD 2006 with a time delay of tPD1. The primary RCD 2006 is configured to signal the primary data buffers 2004 with a time delay of tPD5 (e.g., using the BCOM bus). The primary RCD 2006 sends the read command and the address to a DIMM RCD 2016 of the memory module 2020 with a time delay of tPD2. The DIMM RCD 2016 sends appropriate portions of the read command, address, and parity to the DRAM 2018 and DIMM DB 2014 of the memory module 2020. The DIMM DB 2014 receives data in response to the read command from the DRAM 2018. The DIMM DB 2014 sends the data to the primary data buffers 2004 with a delay of tPD3. The primary data buffers 2004 send the data to the memory controller 2002 with a time delay of tPD4. The memory controller is configured to enable capture of the data signal to complete the read operation. The timing delays of tPD1, tPD2, tPD3, tPD4, and tPD5 are configured to allow operation of communications with the double buffered memory topology.

Figure 21:
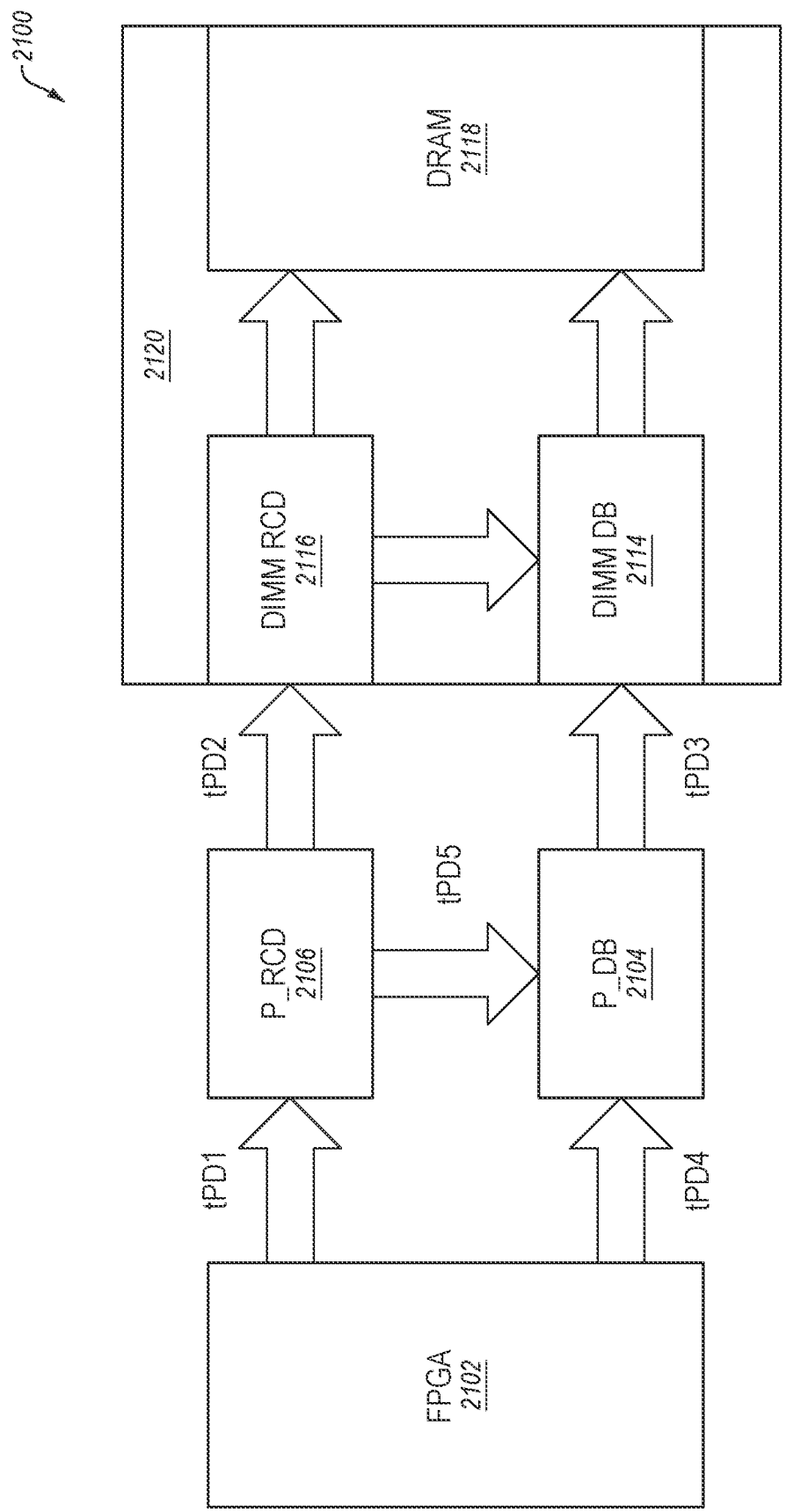
FIG. 21 shows exemplary communications for a write operation of a memory topology with a double buffering configuration having LRDIMMs, where the memory topology comprises a device configured to perform a function of a memory controller, in accordance with various embodiments.

FIG. 21 shows exemplary communications for a write operation of a memory topology with a double buffering configuration having LRDIMMs, where the memory topology comprises a device configured to perform a function of a memory controller, in accordance with various embodiments. FIG. 21 depicts exemplary communications within a system 2100 including a memory controller 2102, a primary RCD 2106, a memory module 2120, and primary data buffers 2104. The primary RCD 2106 is configured to perform one or more functions of a memory controller (e.g., as described with respect to FIG. 19). The memory controller 2102 is coupled to the primary RCD 2106 and the memory module 2120 via a command/address bus. The memory controller 2102 is coupled to the primary data buffers 2104 and the memory module 2120 via a data bus. The memory controller 2102 is coupled to the primary data buffers 2104 via control buses (e.g., for transmission of data buffer control signals 360A-B). It is noted that the primary data buffers 2104 and the DIMM data buffers (DB) 2114 represent multiple buffers (e.g., as shown in FIG. 4). In some embodiments, the memory controller 2102 is an FPGA.

The memory controller 2102 sends a write command, an address, and parity to the primary RCD 2106 with a time delay of tPD1. The primary RCD 2106 signals the primary data buffers 2104 with a time delay of tPD5. The primary data buffers 2104 receive data from the memory controller 2102 with a time delay of tPD4. The primary RCD 2106 sends the write command and the address to a DIMM RCD 2116 of the memory module 2120 with a time delay of tPD2. The DIMM RCD 2116 sends appropriate portions of the write command, the address, and the parity to the DRAM 2118 and DIMM DB 2114 of the memory module 2120. The DIMM DB 2114 receives data from the primary data buffers 2104 with a delay of tPD3. The DIMM DB 2114 sends the data to DRAM 2118 of the memory module 2120. The timing delays of tPD1, tPD2, tPD3, tPD4, and tPD5 are configured to allow operation of communications with the double buffered memory topology.

Figure 22:
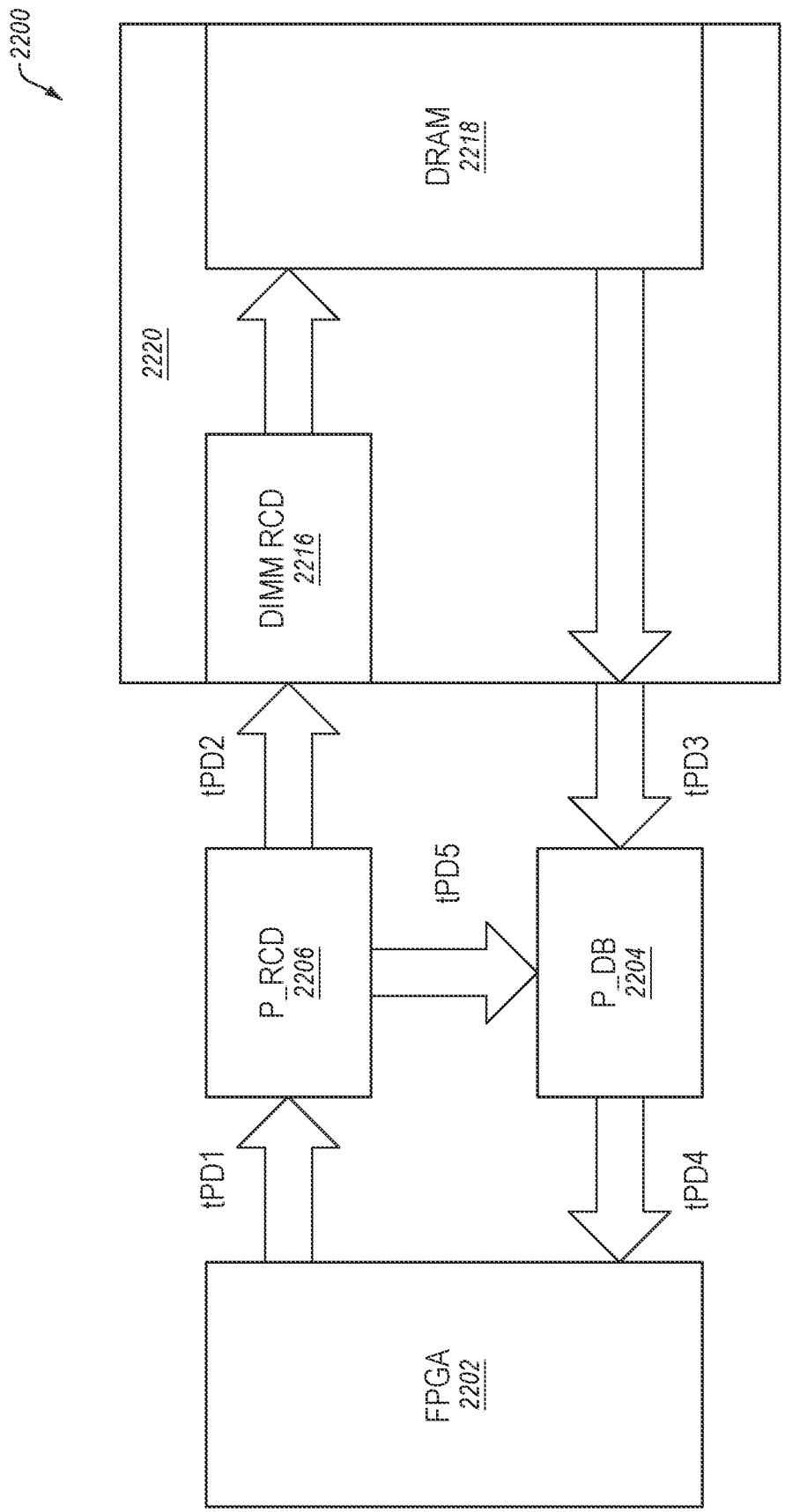
FIG. 22 shows exemplary communications for a read operation of a memory topology with a double buffering configuration having registered dual in-line memory modules (RDIMMs), where the memory topology comprises a device configured to perform a function of a memory controller, in accordance with various embodiments.

FIG. 22 shows exemplary communications for a read operation of a memory topology with a double buffering configuration having registered dual in-line memory modules (RDIMMs), where the memory topology comprises a device configured to perform a function of a memory controller, in accordance with various embodiments.

FIG. 22 depicts exemplary communications within a system 2200 including a memory controller 2202, a primary RCD 2206, a memory module 2220, and primary data buffers 2204. The memory controller 2202 is coupled to the primary RCD 2206 and the memory module 2220 via a command/address bus. The primary RCD 2206 is configured to perform one or more functions of a memory controller (e.g., as described with respect to FIG. 19). The memory controller 2202 is coupled to the primary data buffers 2204 and the memory module 2220 via a data bus. The memory controller 2202 is coupled to the primary data buffers 2204 via control buses (e.g., for transmission of data buffer control signals 360A-B). It is noted that the primary data buffers 2204 represent multiple buffers (e.g., as shown in FIG. 4). In some embodiments, the memory controller 2202 is an FPGA.

The memory controller 2202 sends a read command, an address, and parity to the primary RCD 2206 with a time delay of tPD1. The primary RCD 2106 signals the primary data buffers 2204 with a time delay of tPD5. The primary RCD 2206 sends the read command, the address, and the parity to a DIMM RCD 2216 of the memory module 2220 with a time delay of tPD2. The DIMM RCD 2216 sends the read command and the address to the DRAM 2218 of the memory module 2220. The DRAM 2218 sends the data to the primary data buffers 2204 with a delay of tPD3. The primary data buffers 2204 send the data to the memory controller 2202 with a time delay of tPD4. The timing delays of tPD1, tPD2, tPD3, tPD4, and tPD5 are configured to allow operation of communications with the double buffered memory topology.

Figure 23:
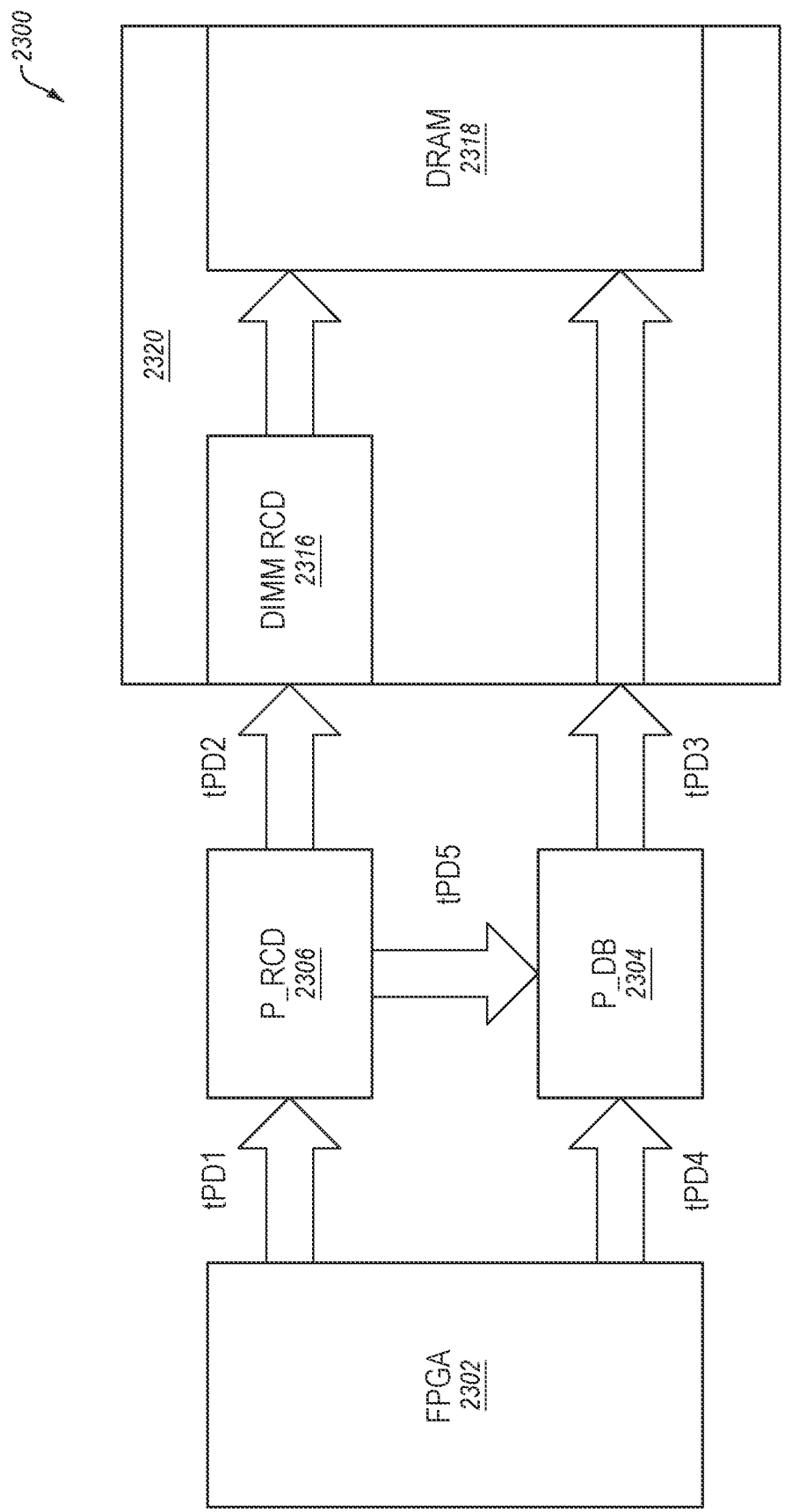
FIG. 23 shows exemplary communications for a write operation of a memory topology with a double buffering configuration having RDIMMs, where the memory topology comprises a device configured to perform a function of a memory controller, in accordance with various embodiments.

FIG. 23 shows exemplary communications for a write operation of a memory topology with a double buffering configuration having RDIMMs, where the memory topology comprises a device configured to perform a function of a memory controller, in accordance with various embodiments. FIG. 23 depicts exemplary communications within a system 2300 including a memory controller 2302, a primary RCD 2306, a memory module 2320, and primary data buffers 2304. The memory controller 2302 is coupled to the primary RCD 2306 and the memory module 2320 via a command/address bus. The primary RCD 2306 is configured to perform one or more functions of a memory controller (e.g., as described with respect to FIG. 19). The memory controller 2302 is coupled to the primary data buffers 2304 and the memory module 2320 via a data bus. The memory controller 2302 is coupled to the primary data buffers 2304 via control buses (e.g., for transmission of data buffer control signals 360A-B). It is noted that the primary data buffers 2304 represent multiple buffers (e.g., as shown in FIG. 4). In some embodiments, the memory controller 2302 is an FPGA.

The memory controller 2302 sends a write command, an address, and parity to the primary RCD 2306 with a time delay of tPD1. The primary RCD 2306 signals the primary data buffers 2304 with a time delay of tPD5. The primary data buffers 2304 receive data from the memory controller 2302 with a time delay of tPD4. The primary RCD 2306 sends the write command, the address, and the parity to a DIMM RCD 2316 of the memory module 2320 with a time delay of tPD2. The DIMM RCD 2316 sends appropriate portions of the write command, the address, and the parity to the DRAM 2318 of the memory module 2320.

The memory module 2320 receives data from the primary data buffers 2304 with a delay of tPD3. The memory module 2320 sends the data to the DRAM 2318 of the memory module 2320. The timing delays of tPD1, tPD2, tPD3, tPD4, and tPD5 are configured to allow operation of communications with the double buffered memory topology.

Figure 24:
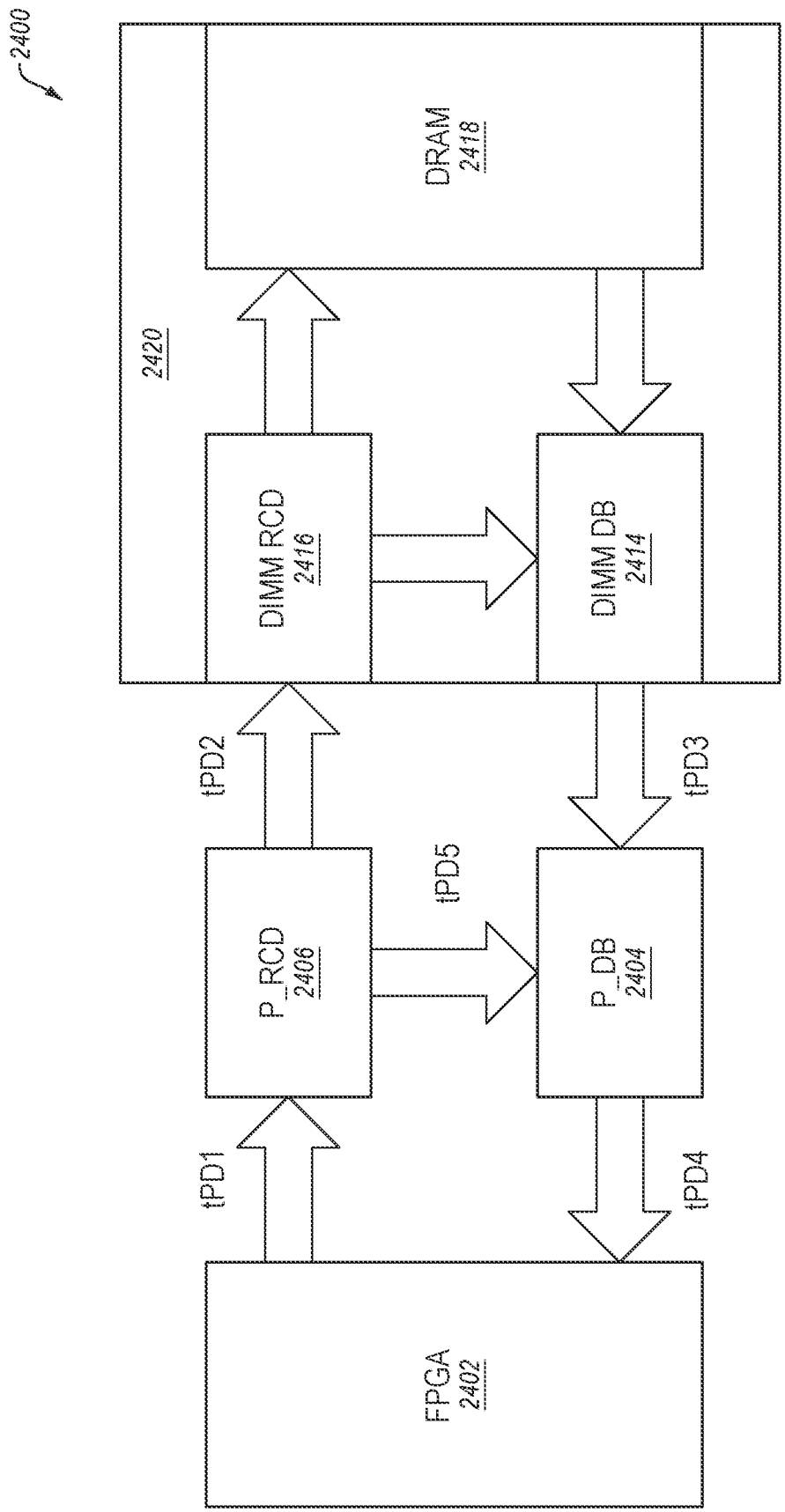
FIG. 24 shows exemplary communications for a read training operation of a memory topology with a double buffering configuration having LRDIMMs, where the memory topology comprises a device configured to perform a function of a memory controller, in accordance with various embodiments.

FIG. 24 shows exemplary communications for a read training operation of a memory topology with a double buffering configuration having LRDIMMs, where the memory topology comprises a device configured to perform a function of a memory controller, in accordance with various embodiments. FIG. 24 depicts exemplary communications within a system 2400 including a memory controller 2402, a primary RCD 2406, a memory module 2420, and primary data buffers 2404. The memory controller 2402 is coupled to the primary RCD 2406 and the memory module 2420 via a command/address bus. The primary RCD 2406 is configured to perform one or more functions of a memory controller (e.g., as described with respect to FIG. 19). The primary RCD 2406 is configured to signal the primary data buffers 2404 to be in transparent mode during training operations. The memory controller 2402 is coupled to the primary data buffers 2404 and the memory module 2420 via a data bus. The memory controller 602 is coupled to the primary data buffers 604 via control buses (e.g., for transmission of data buffer control signals 360A-B). It is noted that the primary data buffers 2404 and the DIMM data buffers (DB) 2414 represent multiple buffers (e.g., as shown in FIG. 4). In some embodiments, the memory controller 2402 is an FPGA.

The memory controller 2402 sends a read command, an address, and parity to the primary RCD 2406 with a time delay of tPD1. The primary RCD 2406 signals the primary data buffers 2404 with a time delay of tPD5. The primary RCD 2406 sends the read command, the address, and the parity to a DIMM RCD 2416 of the memory module 2420 with a time delay of tPD2. The DIMM RCD 2416 send appropriate portions of the read command, the address, and the parity to the DRAM 2418 and DIMM data buffer (DB) 2414 of the memory module 2420. The DIMM DB 2414 receives data in response to the read command from the DRAM 2418. The DIMM DB 2414 sends the data to the primary data buffers 2404 with a delay of tPD3. The primary data buffers 2404 send the data to the memory controller 2402 with a time delay of tPD4. The timing delays of tPD1, tPD2, tPD3, tPD4, and tPD5 are configured to allow initialization and/or training of communications with the double buffered memory topology.

Figure 25:
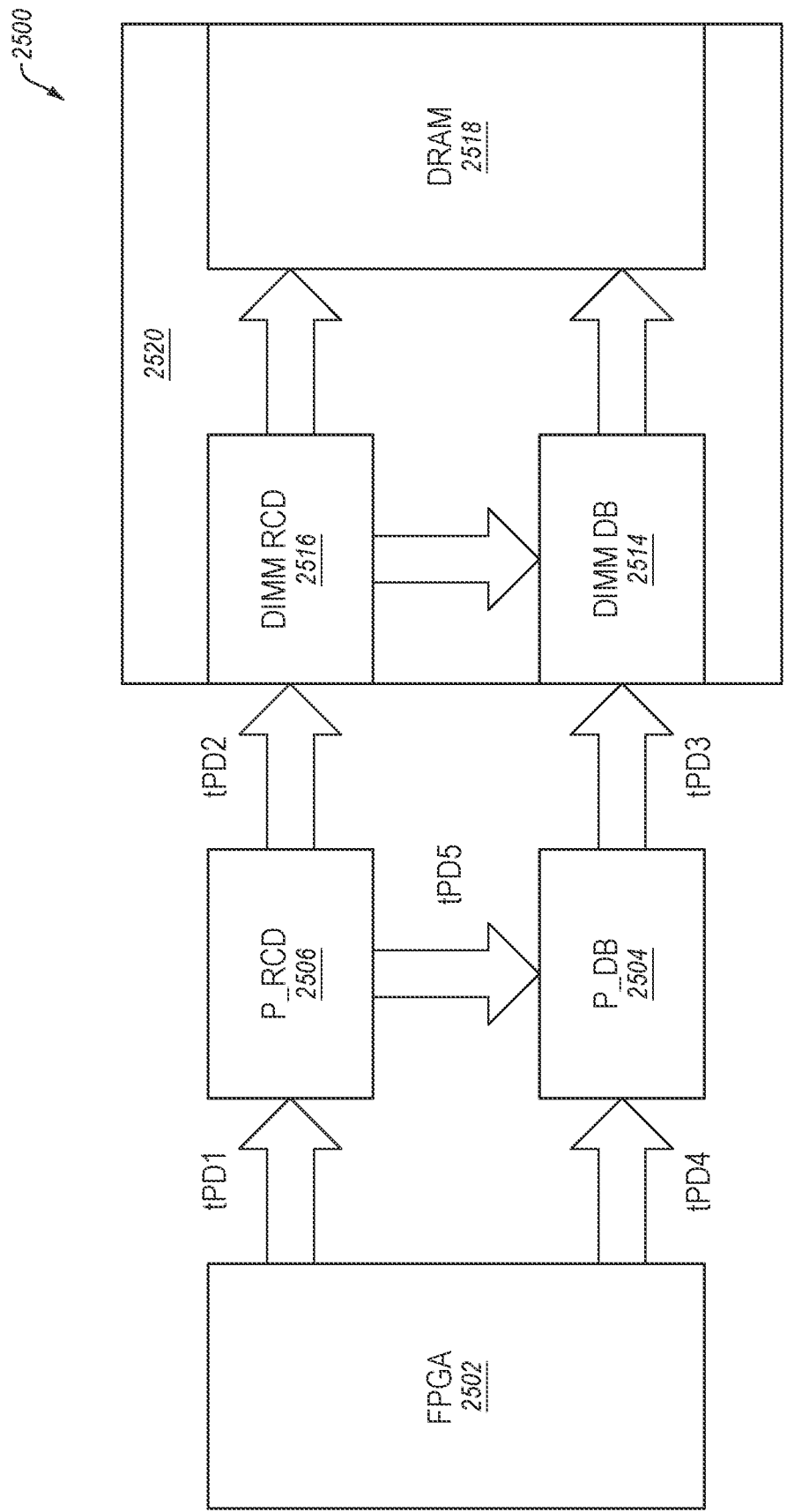
FIG. 25 shows exemplary communications for a write training operation of a memory topology with a double buffering configuration having LRDIMMs, where the memory topology comprises a device configured to perform a function of a memory controller, in accordance with various embodiments.

FIG. 25 shows exemplary communications for a write training operation of a memory topology with a double buffering configuration having LRDIMMs, where the memory topology comprises a device configured to perform a function of a memory controller, in accordance with various embodiments. FIG. 25 depicts exemplary communications within a system 2500 including a memory controller 2502, a primary RCD 2506, a memory module 2520, and primary data buffers 2504 during the a write training operation. The memory controller 2502 is coupled to the primary RCD 2506 and the memory module 2520 via a command/address bus. The primary RCD 2506 is configured to perform one or more functions of a memory controller (e.g., as described with respect to FIG. 19). The primary RCD 2506 is configured to signal the primary data buffers 2504 to be in transparent mode during training operations. The memory controller 2502 is coupled to the primary data buffers 2504 and the memory module 2520 via a data bus. The memory controller 602 is coupled to the primary data buffers 604 via control buses (e.g., for transmission of data buffer control signals 360A-B). It is noted that the primary data buffers 2504 and the DIMM data buffers (DB) 2514 represent multiple buffers (e.g., as shown in FIG. 4). In some embodiments, the memory controller 2502 is an FPGA.

The memory controller 2502 sends a write command, an address, and parity to the primary RCD 2506 with a time delay of tPD1. The primary RCD 2506 signals the primary data buffers 2504 with a time delay of tPD5. The primary data buffers 2504 receive data from the memory controller 2502 with a time delay of tPD4. The primary RCD 2506 sends the write command, the address, and the parity to a DIMM RCD 2516 of the memory module 2520 with a time delay of tPD2. The DIMM RCD 2516 sends appropriate portions of the write command, the address, and the parity to the DRAM 2518 and DIMM DB 2514 of the memory module 2520. The DIMM DB 2514 receives data from the primary data buffers 2504 with a delay of tPD3. The DIMM DB 2514 sends the data to the DRAM 2518 of the memory module 2520. The timing delays of tPD1, tPD2, tPD3, tPD4, and tPD5 are configured to allow operation of communications with the double buffered memory topology.

Figure 26:
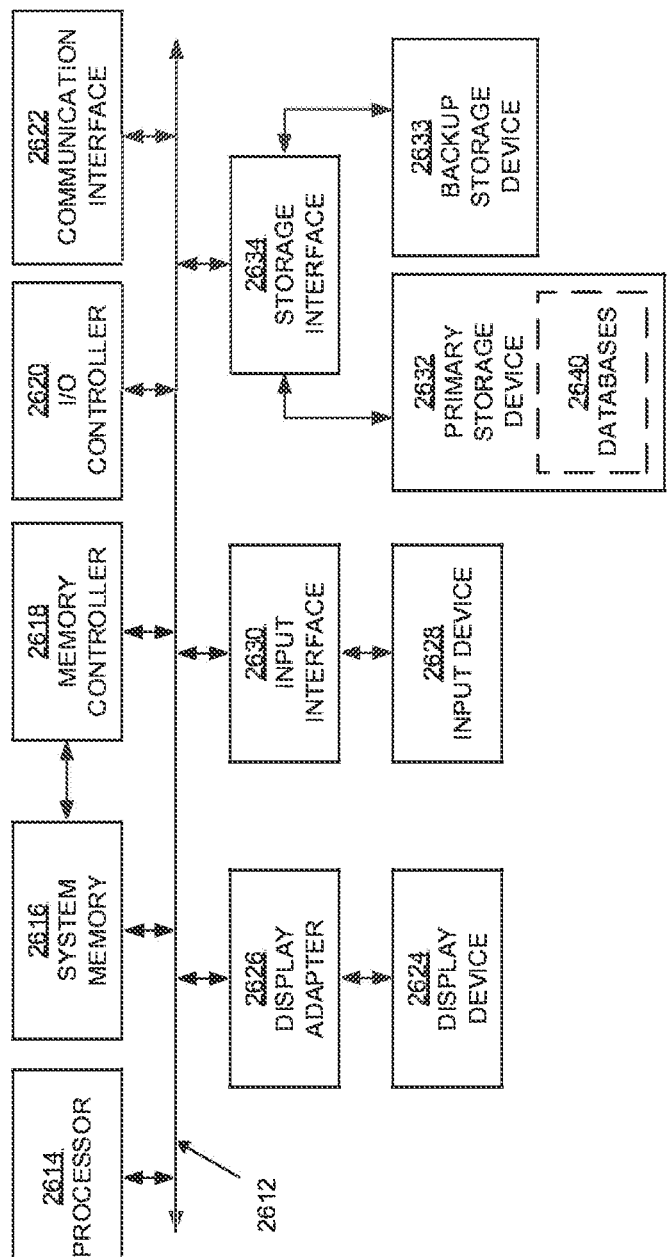
FIG. 26 is a block diagram of an exemplary computing system including various embodiments.

FIG. 26 is a block diagram of an exemplary computing system 2600 including various embodiments. Computing system 2600 broadly represents any single or multi-processor computing device or system capable of executing computer-readable instructions. Examples of computing system 2600 include, without limitation, workstations, laptops, client-side terminals, servers, distributed computing systems, handheld devices, or any other computing system or device. In one configuration, computing system 2600 may include at least one processor 2614 and a system memory 2616.

Processor 2614 generally represents any type or form of processing unit capable of processing data or interpreting and executing instructions. In certain embodiments, processor 2614 may receive instructions from a software application or module. These instructions may cause processor 2614 to perform the functions of one or more of the example embodiments described and/or illustrated herein. For example, processor 2614 may perform and/or be a means for performing, either alone or in combination with other elements, one or more of the identifying, determining, using, implementing, translating, tracking, receiving, moving, and providing described herein. Processor 2614 may also perform and/or be a means for performing any other steps, methods, or processes described and/or illustrated herein.

System memory 2616 generally represents any type or form of volatile or non-volatile storage device or medium capable of storing data and/or other computer-readable instructions. Examples of system memory 2616 include, without limitation, RAM, ROM, FLASH memory, or any other suitable memory device. Although not required, in certain embodiments computing system 2600 may include both a volatile memory unit (such as, for example, system memory 2616) and a non-volatile storage device (such as, for example, primary storage device 2632. The system memory 2616 can include memory modules, e.g., DIMMs 0-7. In some embodiments, the system memory 2616 includes the sets of data buffers 204 and the primary RCD 206 or the sets of data buffers 1904 and the primary RCD 1906.

Computing system 2600 may also include one or more components or elements in addition to processor 2614 and system memory 2616. For example, in the embodiment of FIG. 8, computing system 2600 includes a memory controller 2618, an I/O controller 2620, and a communication interface 2622, each of which may be interconnected via a communication infrastructure 2612.

Communication infrastructure 2612 generally represents any type or form of infrastructure capable of facilitating communication between one or more components of a computing device. Examples of communication infrastructure 2612 include, without limitation, a communication bus (such as an ISA, PCI, PCIe, or similar bus) and a network. In one embodiment, system memory 2616 communicates via a dedicated memory bus.

Memory controller 2618 generally represents any type or form of device capable of handling memory or data or controlling communication between one or more components of computing system 2600. For example, memory controller 2618 may control communication between processor 2614, system memory 2616, and I/O controller 2620 via communication infrastructure 2612. Memory controller 2618 may perform and/or be a means for performing, either alone or in combination with other elements, one or more of the operations or features described herein. In some embodiments, the memory controller 2618 includes the memory controller 202 or the memory controller 1902.

I/O controller 2620 generally represents any type or form of module capable of coordinating and/or controlling the input and output functions of a computing device. For example, I/O controller 2620 may control or facilitate transfer of data between one or more elements of computing system 2600, such as processor 2614, system memory 2616, communication interface 2622, display adapter 2626, input interface 2630, and storage interface 2634. I/O controller 2620 may be used, for example, to perform and/or be a means for performing, either alone or in combination with other elements, one or more of the operations described herein. I/O controller 2620 may also be used to perform and/or be a means for performing other operations and features set forth in the instant disclosure.

Communication interface 2622 broadly represents any type or form of communication device or adapter capable of facilitating communication between example computing system 2600 and one or more additional devices. For example, communication interface 2622 may facilitate communication between computing system 2600 and a private or public network including additional computing systems. Examples of communication interface 2622 include, without limitation, a wired network interface (such as a network interface card), a wireless network interface (such as a wireless network interface card), a modem, and any other suitable interface. In one embodiment, communication interface 2622 provides a direct connection to a remote server via a direct link to a network, such as the Internet. Communication interface 2622 may also indirectly provide such a connection through, for example, a local area network (such as an Ethernet network), a personal area network, a telephone or cable network, a cellular telephone connection, a satellite data connection, or any other suitable connection.

Communication interface 2622 may also represent a host adapter configured to facilitate communication between computing system 2600 and one or more additional network or storage devices via an external bus or communications channel. Examples of host adapters include, without limitation, SCSI host adapters, USB host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 2622 may also allow computing system 2600 to engage in distributed or remote computing. For example, communication interface 2622 may receive instructions from a remote device or send instructions to a remote device for execution. Communication interface 2622 may perform and/or be a means for performing, either alone or in combination with other elements, one or more of the operations disclosed herein. Communication interface 2622 may also be used to perform and/or be a means for performing other operations and features set forth in the instant disclosure.

As illustrated in FIG. 26, computing system 2600 may also include at least one display device 2624 coupled to communication infrastructure 2612 via a display adapter 2626. Display device 2624 generally represents any type or form of device capable of visually displaying information forwarded by display adapter 2626. Similarly, display adapter 2626 generally represents any type or form of device configured to forward graphics, text, and other data from communication infrastructure 2612 (or from a frame buffer, as known in the art) for display on display device 2624.

As illustrated in FIG. 26, computing system 2600 may also include at least one input device 2628 coupled to communication infrastructure 2612 via an input interface 2630. Input device 2628 generally represents any type or form of input device capable of providing input, either computer- or human-generated, to computing system 2600. Examples of input device 2628 include, without limitation, a keyboard, a pointing device, a speech recognition device, or any other input device. In one embodiment, input device 2628 may perform and/or be a means for performing, either alone or in combination with other elements, one or more of the operations disclosed herein. Input device 2628 may also be used to perform and/or be a means for performing other operations and features set forth in the instant disclosure.

As illustrated in FIG. 26, computing system 2600 may also include a primary storage device 2632 and a backup storage device 2633 coupled to communication infrastructure 2612 via a storage interface 2634. Storage devices 2632 and 2633 generally represent any type or form of storage device or medium capable of storing data and/or other computer-readable instructions. For example, storage devices 2632 and 2633 may be a magnetic disk drive (e.g., a so-called hard drive), a floppy disk drive, a magnetic tape drive, an optical disk drive, a FLASH drive, or the like. Storage interface 2634 generally represents any type or form of interface or device for transferring data between storage devices 2632 and 2633 and other components of computing system 2600.

In one example, databases 2640 may be stored in primary storage device 2632. Databases 2640 may represent portions of a single database or computing device or a plurality of databases or computing devices. For example, databases 2640 may represent (be stored on) a portion of computing system 2600 and/or portions of example network architecture 2700 in FIG. 27 (below). Alternatively, databases 2640 may represent (be stored on) one or more physically separate devices capable of being accessed by a computing device, such as computing system 2600 and/or portions of network architecture 2700.

Continuing with reference to FIG. 26, storage devices 2632 and 2633 may be configured to read from and/or write to a removable storage unit configured to store computer software, data, or other computer-readable information. Examples of suitable removable storage units include, without limitation, a floppy disk, a magnetic tape, an optical disk, a FLASH memory device, or the like. Storage devices 2632 and 2633 may also include other similar structures or devices for allowing computer software, data, or other computer-readable instructions to be loaded into computing system 2600. For example, storage devices 2632 and 2633 may be configured to read and write software, data, or other computer-readable information. Storage devices 2632 and 2633 may also be a part of computing system 2600 or may be separate devices accessed through other interface systems.

Storage devices 2632 and 2633 may be used to perform, and/or be a means for performing, either alone or in combination with other elements, one or more of the operations disclosed herein. Storage devices 2632 and 2633 may also be used to perform, and/or be a means for performing, other operations and features set forth in the instant disclosure.

Many other devices or subsystems may be connected to computing system 2600. Conversely, all of the components and devices illustrated in FIG. 26 need not be present to practice the embodiments described herein. The devices and subsystems referenced above may also be interconnected in different ways from that shown in FIG. 26. Computing system 2600 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 2600. All or a portion of the computer program stored on the computer-readable medium may then be stored in system memory 2616 and/or various portions of storage devices 2632 and 2633. When executed by processor 2614, a computer program loaded into computing system 2600 may cause processor 2614 to perform and/or be a means for performing the functions of the example embodiments described and/or illustrated herein. Additionally or alternatively, the example embodiments described and/or illustrated herein may be implemented in firmware and/or hardware. For example, computing system 2600 may be configured as an ASIC adapted to implement one or more of the embodiments disclosed herein.

Figure 27:
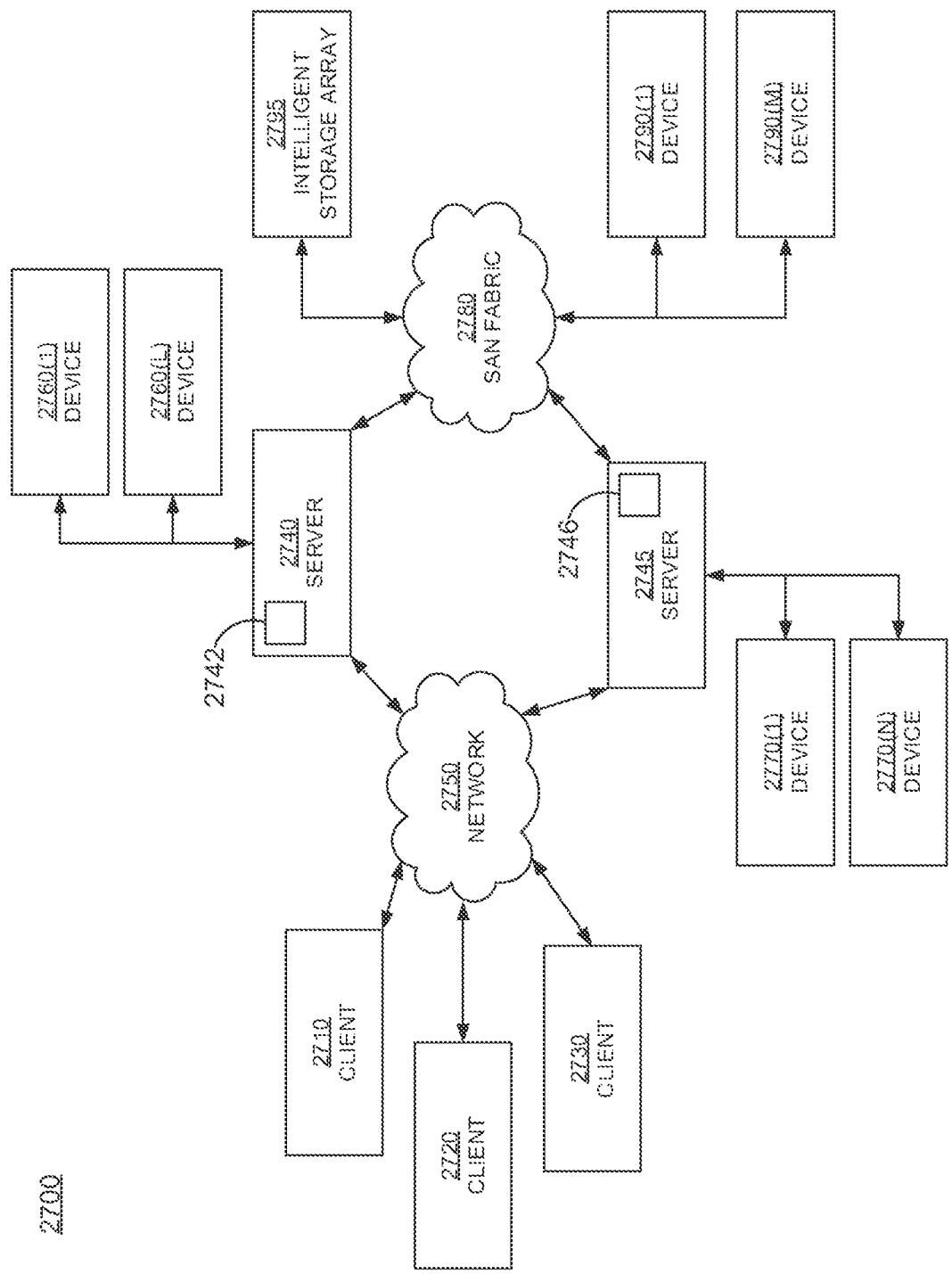
FIG. 27 is a block diagram of an exemplary operating environment, in accordance with various embodiments.

FIG. 27 is a block diagram of an example of an operating environment 2700 in which client systems 2710, 2720, and 2730 and servers 2740 and 2745 may be coupled to a network 2750. Client systems 2710, 2720, and 2730 generally represent any type or form of computing device or system, such as computing system 2600 of FIG. 26.

Similarly, servers 2740 and 2745 generally represent computing devices or systems, such as application servers or database servers, configured to provide various database services and/or run certain software applications. In some embodiments, the servers 2740 may include one or memory controllers and topologies 2742, as described herein. In some embodiments, the servers 2745 may include one or more memory controllers and memory topologies 2746, as described herein. The one or more memory controllers and memory topologies 2742-2746 can include the memory controller 202, the sets of data buffers 204A-B, and the primary RCD 206. The one or more memory controllers and memory topologies 2742-2746 can include the memory controller 1902, the sets of data buffers 1904A-B, and the primary RCD 1906. Network 2750 generally represents any telecommunication or computer network including, for example, an intranet, a WAN, a LAN, a PAN, or the Internet.

As illustrated in FIG. 27, one or more storage devices 2760(1)-(L) may be directly attached to server 2740. Similarly, one or more storage devices 2770(1)-(N) may be directly attached to server 2745. Storage devices 2760(1)-(L) and storage devices 2770(1)-(N) generally represent any type or form of storage device or medium capable of storing data and/or other computer-readable instructions. Storage devices 2760(1)-(L) and storage devices 2770(1)-(N) may represent NAS devices configured to communicate with servers 2740 and 2745 using various protocols, such as NFS, SMB, or CIFS.

Servers 2740 and 2745 may also be connected to a SAN fabric 2780. SAN fabric 2780 generally represents any type or form of computer network or architecture capable of facilitating communication between storage devices. SAN fabric 2780 may facilitate communication between servers 2740 and 2745 and storage devices 2790(1)-(M) and/or an intelligent storage array 2795. SAN fabric 2780 may also facilitate, via network 2750 and servers 2740 and 2745, communication between client systems 2710, 2720, and 2730 and storage devices 2790(1)-(M) and/or intelligent storage array 2795 in such a manner that devices 2790(1)-(M) and array 2795 appear as locally attached devices to client systems 2710, 2720, and 2730. As with storage devices 2760(1)-(L) and storage devices 2770(1)-(N), storage devices 2790(1)-(M) and intelligent storage array 2795 generally represent any type or form of storage device or medium capable of storing data and/or other computer-readable instructions.

With reference to computing system 2600 of FIG. 26, a communication interface, such as communication interface 2622, may be used to provide connectivity between each client system 2710, 2720, and 2730 and network 2750. Client systems 2710, 2720, and 2730 may be able to access information on server 2740 or 2745 using, for example, a Web browser or other client software. Such software may allow client systems 2710, 2720, and 2730 to access data hosted by server 2740, server 2745, storage devices 2760 (1)-(L), storage devices 2770(1)-(N), storage devices 2790 (1)-(M), or intelligent storage array 2795. Although FIG. 27 depicts the use of a network (such as the Internet) for exchanging data, the embodiments described herein are not limited to the Internet or any particular network-based environment.

The above described embodiments may be used, in whole or in part, in systems that process large amounts of data and/or have tight latency constraints, and, in particular, with systems using one or more of the following protocols and formats: Key-Value (KV) Store, Memcached, Redis, Neo4J (Graph), Fast Block Storage, Swap Device, and Network RAMDisk. In addition, the above described embodiments may be used, in whole or in part, in systems employing virtualization, Virtual Desktop Infrastructure (VDI), distributed storage and distributed processing (e.g., Apache Hadoop), data analytics cluster computing (e.g., Apache Spark), Infrastructure as a Service (IaaS), Platform as a Service (PaaS), and other cloud computing platforms (e.g., Vmware vCloud, Open Stack, and Microsoft Azure). Further, the above described embodiments may be used, in whole or in party, in systems conducting various types of computing, including Scale Out, Disaggregation, Multi-Thread/Distributed Processing, RackScale, Data Center Scale Computing, Elastic Memory Provisioning, Memory as a Service, page migration and caching and Application Offloading/Acceleration and Integration, using various types of storage, such as Non-Volatile Memory Express, Flash, Multi-Tenancy, Internet Small Computer System Interface (iSCSI), Object Storage, Scale Out storage, and using various types of networking, such as 10/40/100 GbE, Software-Defined Networking, Silicon Photonics, Rack TOR Networks, and Low-Latency networking.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed:

1. A system comprising:
   a dual in-line memory module (DIMM) comprising a plurality of memory devices;
   a driver circuit coupled to the DIMM, wherein the driver circuit is configured to receive a first read command from a memory controller and send the first read command to the DIMM to instruct the DIMM to access a memory location in the plurality of memory devices and provide first data from the memory location; and
   a data buffer coupled to the DIMM, wherein the data buffer is configured to receive a second read command from the memory controller, the second read command requesting the data buffer to provide the first data received from the memory location to the memory controller, wherein the second read command at least partially overlaps in time with the first read command.

2. The system of claim 1, wherein the data buffer is further configured to send the data received from the memory location to the memory controller, wherein the data is sent to the memory controller in accordance with the second read command.

3. The system of claim 1, wherein the data buffer is further configured to receive the data to be written to the DIMM from the controller.

4. The system of claim 1, wherein the driver circuit comprises a register clock driver.

5. The system of claim 1, wherein the DIMM comprises a plurality of DRAM devices storing the data at the memory location.

6. The system of claim 1, wherein the second read command comprises a buffer communication (BCOM) bus signal.

7. The system of claim 1, wherein the driver circuit is further configured to send a signal to the DIMM, wherein the signal comprises one of a clock enable (CKE) signal, an on-die termination (ODT) signal, a chip select (CSN) signal, or a chip ID (C2) signal.

8. A method comprising:
   receiving, at a driver circuit coupled to a dual in-line memory module (DIMM) comprising a plurality of memory devices, a first read command from a memory controller and sending the first read command to the DIMM to instruct the DIMM to access a memory location in the plurality of memory devices and provide first data from the memory location; and
   receiving, at a data buffer coupled to the DIMM, a second read command from the memory controller, the second read command requesting the data buffer to provide the first data received from the memory location to the memory controller, wherein the second read command at least partially overlaps in time with the first read command.

9. The method of claim 8, further comprising:
   sending, by the data buffer, the data received from the memory location to the memory controller, wherein the data is sent to the memory controller in accordance with the second read command.

10. The method of claim 8, further comprising:
    receiving, by the data buffer, the data to be written to the DIMM from the controller.

11. The method of claim 8, wherein the driver circuit comprises a register clock driver.

12. The method of claim 8, wherein the DIMM comprises a plurality of DRAM devices storing the data at the memory location.

13. The method of claim 8, wherein the second read command comprises a buffer communication (BCOM) bus signal.

14. The method of claim 8, further comprising:
    sending, by the driver circuit, a signal to the DIMM, wherein the signal comprises one of a clock enable (CKE) signal, an on-die termination (ODT) signal, a chip select (CSN) signal, or a chip ID (C2) signal.

15. A system comprising:
    a dual in-line memory module (DIMM) comprising a plurality of memory devices;
    a driver circuit coupled to the DIMM, wherein the driver circuit is configured to receive, with a first time delay, a first read command from a memory controller and send the first read command to the DIMM to instruct the DIMM to access a memory location in the plurality of memory devices and provide first data from the memory location; and
    a data buffer coupled to the DIMM, wherein the data buffer is configured to receive, with a second time delay, a second read command from the memory controller, the second read command requesting the data buffer to provide the first data received from the memory location to the memory controller, wherein the first time delay of the first read command and the second time delay of the second read command cause the second read command to at least partially overlap in time with the first read command during operation of the DIMM.

16. The system of claim 15, wherein the data buffer is further configured to send the data received from the memory location to the memory controller, wherein the data is sent to the memory controller in accordance with the second read command.

17. The system of claim 15, wherein the data buffer is further configured to receive the data to be written to the DIMM from the controller.

18. The system of claim 15, wherein the driver circuit comprises a register clock driver.

19. The system of claim 15, wherein the DIMM comprises a plurality of DRAM devices storing the data at the memory location.

20. The system of claim 15, wherein the second read command comprises a buffer communication (BCOM) bus signal.

* * * * *